United States Patent
Krishnan et al.

(10) Patent No.: US 9,293,786 B1
(45) Date of Patent: Mar. 22, 2016

(54) SOLID ORGANIC ELECTROLYTES

(75) Inventors: Sitaraman Krishnan, Potsdam, NY (US); Lalitha Ganapatibhotla, Potsdam, NY (US); Dipankar Roy, Potsdamn, NY (US); Jianping Zheng, Potsdam, NY (US)

(73) Assignee: Clarkson University, Potsdam, NY (US)

( * ) Notice: Subject to any disclaimer, the term of this patent is extended or adjusted under 35 U.S.C. 154(b) by 455 days.

(21) Appl. No.: 12/778,410

(22) Filed: May 12, 2010

Related U.S. Application Data

(60) Provisional application No. 61/213,184, filed on May 12, 2009.

(51) Int. Cl.
*H01G 11/58* (2013.01)
*H01M 10/0564* (2010.01)
*H01M 14/00* (2006.01)
*H01M 10/0566* (2010.01)

(52) U.S. Cl.
CPC ........... *H01M 10/0566* (2013.01); *H01G 11/58* (2013.01)

(58) Field of Classification Search
USPC .......... 252/62.2; 136/263; 429/304, 306, 322; 359/270
See application file for complete search history.

(56) References Cited

U.S. PATENT DOCUMENTS

| | | | |
|---|---|---|---|
| 6,376,765 B1 * | 4/2002 | Wariishi et al. | 136/263 |
| 6,750,352 B2 * | 6/2004 | Ono et al. | 548/341.5 |
| 8,236,887 B2 * | 8/2012 | Komatsu et al. | 524/516 |
| 2011/0041915 A1 * | 2/2011 | Miyasaka et al. | 136/256 |

FOREIGN PATENT DOCUMENTS

| | | | |
|---|---|---|---|
| EP | 1819005 | * | 8/2007 |
| JP | 2003-31270 | * | 1/2003 |
| WO | WO 2007/091517 | * | 8/2007 |
| WO | WO 2009/133806 | * | 11/2009 |

OTHER PUBLICATIONS

Bai et al, "High-performance dye-sensitized solar cells based on solvent-free electrolytes produced from eutectic melts", Nature materials, vol. 7, Aug. 2008, pp. 626-630.*

* cited by examiner

*Primary Examiner* — Carol M Koslow
(74) *Attorney, Agent, or Firm* — Frederick J. M. Price; George R. McGuire; Bond Schoeneck & King, PLLC

(57) ABSTRACT

Solid, or highly viscous, organic electrolytes consisting of alkylimidazolium cation with alkyl, PEGylated and fluorinated side chains of different molecular weights were synthesized and characterized (cf. chemical structures in Schemes 1 and 2). The PEGylated/fluorinated imidazolium iodide is a solid organic electrolyte that has a conductivity of about $2 \times 10^{-5}$ S/cm at 30° C. The ionic conductivity could be significantly increased ($1.11 \times 10^{-4}$ S/cm at 30° C. and S/cm at $2.88 \times 10^{-3}$ at 90° C.) by blending the PEGylated/fluorinated imidazolium iodide with another solid electrolyte, 1-ethyl-3-methylimidazolium iodide (EtMImI). The PEGylated imidazolium iodides synthesized in the present work have conductivities in the range $1.6 \times 10^{-4}$ S/cm to $2 \times 10^{-4}$ S/cm at 30° C. and viscosities in the range 620 cP to 720 cP at 30° C. The iodide counter ion in the present electrolytes supplies the anion for the $I^-/I_3^-$ redox mediators for DSSCs. Therefore, the organic electrolytes of the present invention can be used even without the addition of inorganic salts such as LiI or KI. We found that the addition of an organic solid electrolyte, EtMImI, resulted in an increase in the ionic conductivity of the PEGylated/fluorinated imidazolium iodides, whereas the addition of the inorganic LiI led to a decrease in ionic conductivity. All the electrolytes are thermally stable until high temperatures (250° C. to 300° C.).

7 Claims, 16 Drawing Sheets

SOLID ORGANIC ELECTROLYTES

CROSS REFERENCE

This application is related to Provisional Application 61/213,184 filed on May 12, 2009 and is hereby incorporated in its entirety herein.

GOVERNMENT SUPPORT

Funds for the development of this disclosure were provided under Grant Number W911NF-05-1-0339 awarded by the Army Research Office.

FIELD OF TECHNOLOGY

The present invention pertains to solid organic electrolytes comprising of onium cations and iodide anions, which are suitable for use in dye-sensitized solar cells, lithium ion batteries, electrochromic devices, and supercapacitors.

BACKGROUND

Solid polymer electrolytes are highly attractive alternatives to conventional liquid electrolytes in energy conversion devices such as dye-sensitized solar cells and electrochromic windows, and energy storage devices such as lithium ion batteries and super capacitors, because of issues related to device fabrication and safety.

Dye-sensitized solar cells (DSSCs) have generated considerable interest in recent years, because they can be fabricated at a relatively low-cost, and are suitable for incorporation in flexible substrates using roll-to-roll processing. In addition, DSSCs using Ru-complex sensitizers have power conversion efficiencies as high as 11%, which makes these cells promising cost-effective alternatives to the classical crystalline silicon cells.

In a typical DSSC, titanium dioxide nanoparticles are deposited onto a conductive glass substrate and heated to form a nanoporous coating. The coated substrate is then dipped into a solution of ruthenium containing dye, in order to absorb the dye molecules on $TiO_2$ surface. The pores of the $TiO_2$ coating are further infused with a liquid electrolyte that contains iodide salts. The device fabrication is completed by placing a counter electrode of platinum-coated conductive glass on top of this nanoporous $TiO_2$ coating. Upon absorption of light, the sensitizer molecules inject electrons into the $TiO_2$, and are oxidized. The iodide, $I^-$, in the electrolyte supplies electrons to the oxidized dye, and regenerates the dye. The iodide oxidizes to triiodide, $I_3^-$, during this step. The electrons passing through an external load arrive at the counter electrode (cathode) and reduce the triiodide back to iodide. It is evident that the photo-current density, and the power output of the solar cell, will increase with an increase in the mobility of the redox mediators ($I_3^-/I^-$) in the electrolyte solution.

High power conversion efficiencies (11%) in DSSCs have been obtained using liquid electrolytes, such as acetonitrile, that support high ionic conductivities [See, Chiba. Y.; Islam, A.; Watanabe, Y.; Komiya, R.; Koide, N.; Han, L. Dye-sensitized solar cells with conversion efficiency of 11.1%, *Japan. J. Appl. Phys.* 2006, 45, L638-L640 incorporated herein by reference]. However, conventional (often volatile) liquid electrolytes limit the long-term stability and high temperature operation of DSSCs. Moreover, thermal expansion results in leakage of liquid electrolytes in DSSCs operated at elevated temperatures. Other problems in conventional DSSCs include desorption of dye molecules from the $TiO_2$ surface, and chemical degradation of the catalytic features of the $TiO_2$/Pt electrodes. The development of DSSCs for commercial applications largely relies on successful resolution of these limitations. The organic electrolytes of the present invention overcome the drawbacks of liquid electrolytes. They eliminate problems related to sealing and evaporative loss of solvent.

Organic electrolytes have been explored by several researchers as materials for dye-sensitized solar cells. Salminen et al. have reported physicochemical and biological properties of a variety of piperidinium and pyrrolidinium ionic liquids [See. Salminen, J.; Papaiconomou, N.; Kumar, R. A.; Lee, J.-M.; Kerr, J.; Newman, J.; Prausnitz, J. M. Physicochemical properties and toxicities of hydrophobic piperidinium and pyrrolidinium ionic liquids, *Fluid Phase Equilibria* 2007, 261, 421-426 hereby incorporated herein by reference]. Properties of imidazolium and pyridinium ionic liquids have also been reported [See, Papiconomou, N.; Yakelis, N.; Salminen, J.; Bergman, R.; Prausnitz, J. M. Synthesis and properties of seven ionic liquid containing 1-methyl-3-octylimidazolium or 1-butyl-4-methylpyridinium cations, *J. Chem. Eng. Data* 2006, 51, 1389-1393; and Papiconomou, N.; Salminen, J.; Lee, J.-M.; Prausnitz, J. M. Physicochemical properties of hydrophobic ionic liquids containing 1-octylpyridinium, 1-octyl-2-methylpyridinium, or 1-octyl-4-methylpyridinium cations, *J. Chem. Eng. Data* 2007, 52, 833-840 both hereby incorporated herein by reference]. However, none of these ionic liquids contained iodide anions.

Kawano et al. have reported the use of ionic liquid crystal electrolytes for construction of dye-sensitized solar cells [See, Kawano, R.; Nazeeruddin, M. K.; Sato, A.; Grätzel, M.; Watanabe, M. Amphiphilic ruthenium dye as an ideal sensitizer in conversion of light to electricity using ionic liquid crystal electrolyte, *Electrochem. Commun.* 2007, 9, 1134-1138 hereby incorporated herein by reference]. Liquid blends of different ionic liquids have also been used as electrolytes for DSSCs [See, Kuang, D.; Klein, C.; Zhang, Z.; Ito, S.; Moser, J.-E.; Zakeeruddin, S. M.; Gratzel, M. Stable, high-efficiency ionic-liquid-based mesoscopic dye-sensitized solar cells, *Small* 2007, 3, 2094-2102, hereby incorporated herein by reference]. Gelation agents were used with 1-alkyl-3-methylimidazolium iodides to prepare gel electrolytes for DSSCs [See, Kubo. W.; Kambe, S.; Nakade, S.; Kitamura, T.; Hanabusa, K.; Wada, Y.; Yanagida, S. Photocurrent-determining processes in quasi-solid-state dye-sensitized solar cells using ionic gel electrolytes, *J. Phys. Chem. B* 2003, 107, 4374-4381 hereby incorporated herein by reference]. While all of these electrolytes contained the iodide anion, none of them contained the ethylene oxide, $-CH_2CH_2O-$, or perfluoroethyl, $-CF_2CF_2-$ groups.

Freitas et al. have reported the use of polymer electrolytes based on mixtures of poly(ethylene oxide-co-propylene oxide) and 1-propyl-3-methylimidazolium iodide (PrMImI) in dye-sensitized solar cells [See, Freitas, F. S.; de Freitas, J. N.; Ito, B. I.; De Paoli, M.-A.; Nogueira, A. F. Electrochemical and structural characterization of polymer gel electrolytes based on a PEO copolymer and an imidazolium-based ionic liquid for dye-sensitized solar cells, *ACS Appl. Mater. Interfaces* 2009, 1, 2870-2877 hereby incorporated herein by reference]. Of the different iodide salts that form room-temperature ionic liquids, PrMImI has been a candidate of choice for DSSCs because it has the lowest viscosity [See. Bai. Y.; Cao, Y.; Zhang, J.; Wang, M.; Li, R.; Wang, P.; Zakeeruddin, S. M.; Gratzel, M. High-performance dye-sensitized solar cells based on solvent-free electrolytes produced from eutectic melts. *Nature Mater.* 2008, 7, 626-630 hereby incorporated herein by reference]. A blend containing 70 wt % of PrMImI showed the highest ionic conductivity ($2.4 \times 10^{-3}$ S/cm). In the electrolytes used by Freitas et al., the ethylene oxide groups were not covalently attached to the imidazolium cation. The liquid electrolyte, PrMImI, was present within a non-ionic polymer host matrix [poly(ethylene oxide-co-propylene oxide)]. To achieve high ionic conductivity values, 70 wt % of the polymer electrolyte consisted of the liquid component, PrMImI. Similar blends of PrMImI, or 1-ethyl 3-methylimidazolium thiocyanate, with poly (ethylene oxide) have been reported by Singh et al. [See, Singh, P. K.; Kim, K.-W.; Rhee, H.-W. Ionic liquid (1-methyl 3-propyl imidazolium iodide) with polymer electrolyte for DSSC application, *Polym. Eng. Sci.* 2009, 49, 862-865; Singh, P. K.; Kim, K.-I.; Park, N.-G.; Rhee, H.-W. Dye sensitized solar cell using polymer electrolytes based on poly(ethylene oxide) with an ionic liquid. *Macromol. Symp.* 2007, 249-250, 162-166 hereby incorporated herein by reference]. The ionic liquid resulted in a small reduction in the crystallinity of poly(ethylene oxide), which led to about 2-fold increase in the ionic conductivity. The electrolytes of the present invention, on the contrary, contain organic electrolytes with fluoroalkyl-tagged PEG groups, covalently attached to imidazolium cation. Moreover, these ion conducting solid electrolytes are blended with another solid electrolyte 1-ethyl-3-methylimidazolium iodide (EtMImI) to achieve high ionic conductivities ($1.11 \times 10^{-4}$ S/cm at 30° C. and $2.88 \times 10^{-3}$ S/cm at 90° C.

Kang et al. prepared PEGylated polymer electrolytes using three different approaches. [See, Kang, M.-S.; Kim, J. H.; Won, J.; Kang, Y. S. Oligomer approaches for solid-state dye-sensitized solar cells employing polymer electrolytes, *J. Phys. Chem. C* 2007, 111, 5222-5228 hereby incorporated herein by reference]. In the first approach, supramolecules of PEG oligomer having two quadruple hydrogen bonding sites at both chain ends were used. The formation of quadruple hydrogen bonds, upon evaporation of the solvent used for casting the electrolyte film, resulted in solidification of the electrolyte. In the second approach, an oligomer blend containing amorphous liquid oligomer poly(propylene glycol) was used with high molecular weight poly(ethylene oxide). In the third approach, low molecular weight poly(ethylene glycol) oligomers were solidified using fumed silica nanoparticles to obtain solid polymer electrolyte nanocomposites. In all three approaches, ionic conduction was achieved by adding potassium iodide or the 1-propyl-3-methylimidazolium iodide (PrMImI) ionic liquid. Similar quasi-gel-electrolytes, based on PrMImI have been prepared using biocatalytically synthesized PEGylated polymers [See, Kumar, R.; Sharma, A. K.; Parmar, V. S.; Watterson, A. C.; Chittibabu, K. G.; Kumar, J.; Samuelson, L. A. Flexible, dye-sensitized nanocrystalline solar cells employing biocatalytically synthesized polymeric electrolytes, *Chem. Mater.* 2004, 16, 4841-4846 hereby incorporated herein by reference]. In contrast, the electrolytes of the present invention are not polymer gel electrolytes, but are solids or high viscosity materials that can function in a solid DSSC without a polymer matrix or an inorganic support.

Dicationic bis-imidazolium iodides have been used in the construction of DSSCs, but these electrolytes are liquids at room temperature, with low viscosity [See, Zafer, C.; Ocakoglu, K.; Ozsoy, C.; Icli, S. Dicationic bis-imidazolium molten salts for efficient dye sensitized solar cells. Synthesis and photovoltaic properties. *Electrochmica Acta* 2009, 54, 5709-5714 hereby incorporated herein by reference]. The electrolytes contained the triethylene glycol and the tetraethylene glycol groups, but did not contain fluoroalkyl groups (FIG. 1). The present invention pertains to the use of relatively high viscosity liquids, or solid PEGylated and fluorinated imidazolium iodides, in combination with solid electrolytes such as 1-ethyl-3-methyl imidazolium iodide (EtMImI).

FIG. 1 illustrates ionic liquid electrolytes for DSSC [See, Zafer et al., 2009, ibid.].

Bai et al. found that a mixture of 1-allyl-3-methylimidazolium iodide (AMImI), 1,3-dimethylimidazolium iodide (DMImI), and 1-ethyl-3-methylimidazolium iodide (EtMImI), in a molar ratio of 1:1:1, was a ternary melt with a melting point below 0° C. The ternary melt, with enhanced fluidity, exhibited a room temperature conductivity of $1.68 \times 10^{-3}$ S/cm. In contrast, the EtMImI blends of the present invention were not low-viscosity fluids at room temperature, and yet showed significantly improved ionic conductivity (relative to controls without EtMImI). Amorphous blends, as well as those that contained crystalline phases of EtMImI, showed high ionic conductivity.

Wang et al. have reported polymer electrolytes containing chemically crosslinked gelators [See, Wang, L.; Fang, S.-B.; Lin, Y. Novel polymer electrolytes containing chemically crosslinked gelators for dye-sensitized solar cells, *Polym. Adv. Technol.* 2006, 17, 512-517 hereby incorporated herein by reference]. These electrolytes consisted of a polypyridyl-pendant dendritic derivatives, and multifunctional halogen derivatives of PEG (FIG. 2). Although, these polymers are halogenated (chlorinated), they do not contain the perfluoroalkyl, $-(CF_2CF_2)_yF$, group. Moreover, these high molar mass polymers ($M_n=70,000$ g/mol) will be unable to penetrate the pores of $TiO_2$ efficiently.

FIG. 2 illustrates a high molecular weight multifunctional halogen derivative of PEG [See, Wang et al., 2006, ibid.].

Similarly, Shim et al. have recently reported the use of poly(imidazolium iodide) of the structure shown in FIG. 3, which are not fluorinated [See, Shim, H. J.; Kim, D. W.; Lee, C.; Kang, Y. In situ crosslinked ionic gel polymer electrolytes for dye sensitized solar cells. *Macromol. Res.* 2008, 16, 424-428 hereby incorporated herein by reference]. Moreover, in situ formation of the polymers of Shim et al. required heating the reactive components at 100° C. for 21 h. The conducting iodide anions are formed only during the high temperature curing process (after the precursors of the polymer electrolyte have been injected into the DSSC device). In contrast, the organic electrolytes of the present invention do not require thermal processing for extended time periods, after application on the device.

FIG. 3 illustrates chemical structure of polymer electrolyte reported by Shim et al. [Shim et al., 2008, ibid.]

Quasi-solid dye-sensitized solar cells have been fabricated by surface modification of nanopores in an alumina film, and filling these nanopores with ionic liquid electrolytes [See, Takeshi, K.; Hayase, S.; Kaiho, T.; Taguchi, M. Quasi-solid state dye sensitized solar cells having straight ion paths, *J. Electrochem. Soc.* 2008, 155, K166-K169 hereby incorporated herein by reference]. In contrast, the electrolytes of the present invention can be used even without the porous membrane support.

Polysilsesquioxane polymers prepared using an imidazolium iodide derivatized with covalent attachment of trimethoxysilane group have been used as electrolytes for DSSCs [See, Stathatos, E.; Jovanovski, V.; Orel, B.; Jerman, I.; Lianos, P. Dye-sensitized solar cells made by using a polysilsesquioxane polymeric ionic fluid as redox electrolyte, *J. Phys. Chem. C* 2007, 111, 6528-6532; and Orel, B.; Jese, R.; Vuk, A. S.; Jovariovski, V.; Perse, L. S.; Zumer, M. Structural studies of trimethoxysilane containing R'R"Im$^+$I$^-$ ionic liquid and its nanocomposite with tetramethoxysilane (TMOS), *J. Nanosci Nanotech.* 2006, 6, 382-395 both hereby incorporated herein by reference]. The electrolytes of the present invention do not contain siloxane groups.

Jiang and Fang have reported the synthesis and physicochemical characterization of PEGylated imidazolium iodides, but the use of these electrolytes in dye-sensitized solar cells was not proposed [See, Jiang, J.; Fang, S. New composite polymer electrolytes based on room temperature ionic liquids and polyether, *Polym. Adv. Technol.* 2006, 17, 494-499 hereby incorporated herein by reference].

Lee et al. have reported a polymer gel electrolyte consisting of a blend of a high molecular weight poly(ethylene oxide) ($M_w$~5×10$^6$ g/mol; 47.2 wt % in blend), which is a solid at room temperature, a low molecular weight poly(ethylene glycol) ($M_w$~200 g/mol; 31.5 wt %), which is a liquid at room temperature, and EtMImI ($M_w$238.07 g/mol; 21.3 wt %), to obtain a solid electrolyte with maximum ionic conductivity of 9.2×10$^{-5}$ S/cm [See, Lee, J. Y.; Bhattacharya, B.; Kim, Y. H.; Jung, H.-T.; Park, J.-K. Self degradation of polymer electrolyte based dye-sensitized solar cells and their remedy, *Solid State Commun.* 2009, 149, 307-309 hereby incorporated herein by reference]. On the contrary, blends of the fluorinated imidazolium iodide salts of the present invention do not contain any liquid component (e.g. PEG), and yet show a conductivity of at least 1.11×10$^{-1}$ S/cm at 30° C. and 2.88× 10$^{-3}$ S/cm at 90° C.

Polymer gel electrolytes consisting of solid poly(acrylic acid) matrix, and liquid poly(ethylene glycol) have been reported by Wu et al. [See, Wu, J.; Lan, Z.; Lin, J.; Huang, M.; Hao, S.; Sato, T.; Yin. S. A novel thermosetting gel electrolyte for stable quasi-solid-state dye-sensitized solar cells. *Adv. Mater.* 2007, 19, 4006-4011 hereby incorporated herein by reference]. The gel was loaded with a liquid electrolyte solution consisting of γ-butyrolactone, N-methyl pyrrolidone, sodium iodide and iodine, and used in the fabrication of a dye-sensitized solar cell. The electrolytes of the present invention do not need liquid organic solvents, or inorganic salts (such as NaI or LiI), to exhibit ionic conductivity.

SUMMARY

Solid, or highly viscous, organic electrolytes consisting of alkylimidazolium cation with alkyl, PEGylated and fluorinated side chains of different molecular weights were synthesized and characterized (cf. chemical structures in Schemes 1 and 2). The PEGylated and fluorinated imidazolium iodide with chemical structure represented in Scheme 1 is a solid organic electrolyte that has a conductivity of about 2×10$^{-5}$ S/cm at 30° C. The ionic conductivity could be significantly increased (1.11×10$^{-4}$ S/cm at 30° C. and 2.88×10$^{-3}$ S/cm at 90° C. by blending the PEGylated and fluorinated imidazolium iodide with another solid electrolyte, 1-ethyl-3-methylimidazolium iodide (EtMImI). The PEGylated imidazolium iodides with chemical structures shown in Scheme 2 have conductivities in the range 1.58×10$^{-4}$ S/cm to 1.94×10$^{-4}$ S/cm at 30° C. and viscosities in the range 626 cP to 720 cP at 30° C. The iodide counter ion in the present electrolytes supplies the anion for the I$^-$/I$_3^-$ redox mediators for DSSCs. Therefore, the organic electrolytes of the present invention can be used even without the addition of inorganic salts such as LiI or KI. We found that the addition of an organic solid electrolyte, EtMImI, resulted in an increase in the ionic conductivity of the PEGylated/fluorinated imidazolium iodides, whereas the addition of the inorganic LiI led to a decrease in ionic conductivity. All the electrolytes are thermally stable until high temperatures (250° C. to 300° C.).

In summary the disclosure herein describes an electrolyte composition for ion conduction including organic salts that contain onium ions, and blends of two or more such salts, wherein one or more of the constituents of the blends have an iodide anion. An onium ion is a cation derived from elements of the nitrogen family (Group 15) and oxygen family (Group 16). The onium ions are selected from the group comprising of imidazolium, triazolium, tetrazolium, ammonium, pyridinium, pyridazinium, pyrrolidinium, pyrrolinium, oxazolidinium, piperazinium, piperidinium, morpholinium, thiazolium, isoquinolinium, guanidinium, phosphonium, and sulfonium. The organic salts are used in dye-sensitized solar cells, electrochromic devices, lithium ion batteries, and supercapacitors.

The electrolyte composition may include a blend of organic salts that have chemical structures depicted in formula I:

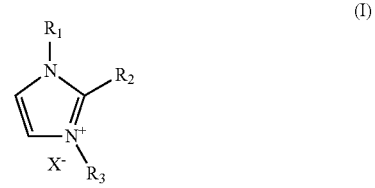

wherein $R_1$, $R_2$, and $R_3$ are independently hydrogen, alkyl, alkenyl, alkynyl, and aryl, provided at least one of $R_1$, $R_2$ and $R_3$ is independently alkyl wherein alkyl is optionally at least partially fluorinated, and X$^-$ is independently iodide, I$^-$, bromide, Br$^-$, chloride, Cl$^-$, perchlorate, ClO$_4^-$, tetrafluoroborate, BF$_4^-$, alkyltrifluoroborate, (perfluoroalkyl)trifluoroborate, dicyanamide, N(CN)$_2^{-1}$, trifluoromethanesulfonate, CF$_3$SO$_3^-$, hexafluorophosphate, PF$_6^-$, bis((trifluoromethyl)sulfonyl)imide, (CF$_3$SO$_2$)$_2$N$^-$, bis((perfluoroethane)sylfonyl)imide, (CF$_3$CF$_2$SO$_2$)$_2$N$^-$, nitro, NO$_2^-$, nitrate, NO$_3^-$, sulfate, SO$_4^-$, or tosylate, wherein in at least one component of the blend, X$^-$ is iodide, I$^-$.

The electrolyte composition disclosed herein may be at least partially fluorinated and includes an alkyl group, that has at least one hydrogen atom replaced by a fluorine atom. The partially fluorinated groups further include any carbon chains, or carbon chains that are interrupted by one or more heteroatoms (for example, oxygen), that contain one of more fluorine atoms.

The electrolyte composition includes an organic salt of formula I wherein at least one of $R_1$, $R_2$ and $R_3$ is independently alkyl-terminated oligo(ethylene glycol):

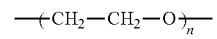

wherein n is about 1 to about 25;

The electrolyte composition further includes an organic salt wherein at least one of $R_1$, $R_2$ and $R_2$ is independently a moiety of formula Z:

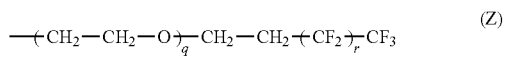

wherein q is independently 1 to about 25; r is independently 0 to about 18;

The electrolyte composition may include an organic salt of formula I wherein at least one of $R_1$, $R_2$ and $R_3$ independently, contains a polymerizable vinyl group, for example, vinyl, acrylate, or methacrylate group.

The electrolyte composition has a viscosity greater than 90,000 cP and an ionic conductivity of at least 1×10$^{-4}$ S/cm at 30° C. Additionally the electrolyte composition has a viscosity greater than 39,000 cP (0.1 s$^{-1}$ shear rate) and an ionic conductivity of at least 2.8×10$^{-3}$ S/cm at 90° C.

The electrolyte composition may be blended with lithium salts for use as electrolytes in lithium ion batteries and electrochromic windows.

The electrolyte composition does not show mass loss greater than 1.5% when heated up to a temperature of 200° C.

In summary the invention herein is an electrolyte composition for ion conduction in dye-sensitized solar cells, electrochromic devices, lithium ion batteries, and supercapacitors, which comprises of organic salts that contain onium ions, and blends of two or more such salts, wherein one or more of the constituents of the blends have an iodide anion.

The term "onium ion" refers to a cation derived from elements of the nitrogen family (Group 15) and the oxygen family (Group 16). Some examples of the onium ion are shown in the following Chart 1.

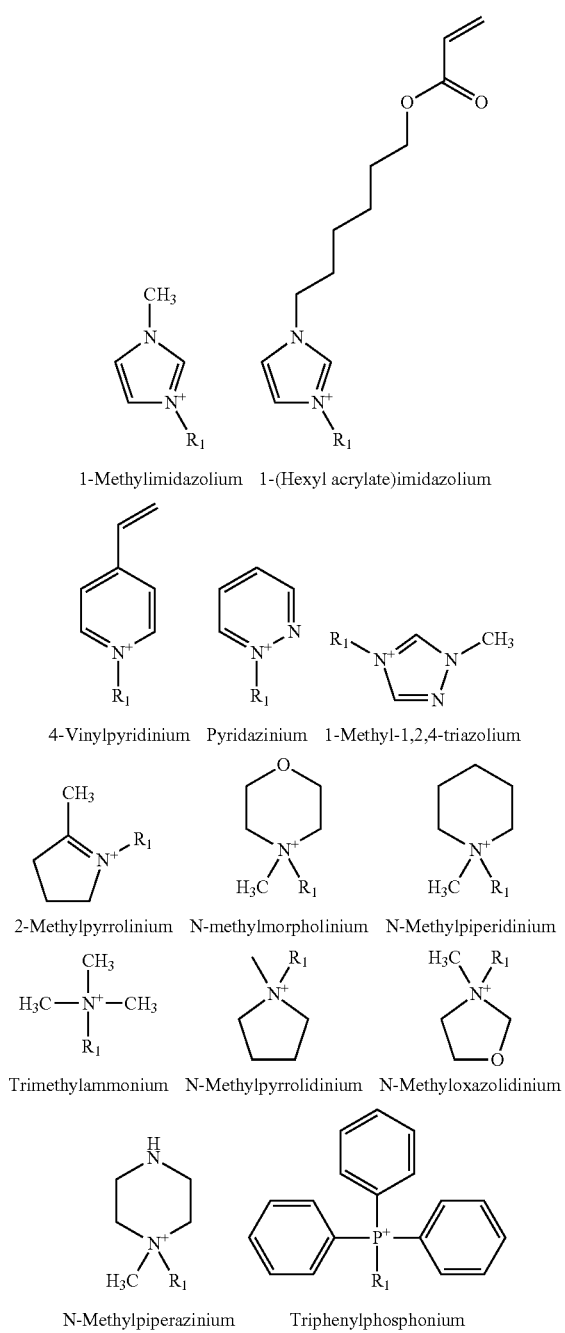

The invention provides a blend of organic salts that includes formula I:

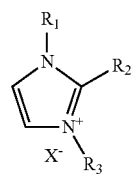

(I)

wherein $R_1$, $R_2$, and $R_3$ are independently hydrogen, alkyl, alkenyl, alkynyl, and phenyl, provided at least one of $R_1$, $R_2$ and $R_3$ is independently alkyl wherein alkyl is optionally at least partially fluorinated;

and $X^-$ is independently iodide, $I^-$, bromide, $Br^-$, chloride, $Cl^-$, perchlorate, $ClO_4^-$, tetrafluoroborate, $BF_4^-$, alkyltrifluoroborate, (perfluoroalkyl)trifluoroborate, dicyanamide, $N(CN)_2^{-1}$, trifluoromethanesulfonate, $CF_3SO_3^-$, hexafluorophosphate, $PF_6^-$, bis((trifluoromethyl)sulfonyl)imide, $(CF_3SO_2)_2N^-$, bis((perfluoroethane)sylfonyl)imide, $(CF_3CF_2SO_2)_2N^-$, nitro, $NO_2^-$, nitrate, $NO_3^-$, sulfate, $SO_4^-$, or tosylate, wherein in at least one component of the blend, $X^-$ is iodide, $I^-$.

At least one of $R_1$, $R_2$ and $R_2$ is independently a moiety of formula Z:

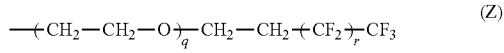

(Z)

wherein q is independently 1 to about 25; r is independently 0 to about 18;

The term "at least partially fluorinated" refers to a group, for example an alkyl group, that has at least one hydrogen atom replaced by a fluorine atom. Partially fluorinated groups include any carbon chains, or carbon chains that are interrupted by one or more heteroatoms (for example, oxygen), that contain one of more fluorine atoms.

BRIEF DESCRIPTION OF THE DRAWINGS

These and other features, aspects, and advantages of the present embodiments(s) of the invention will become better understood with regard to the following description, appended claims, and accompanying drawings where:

DETAILED DESCRIPTION

Figure 1:
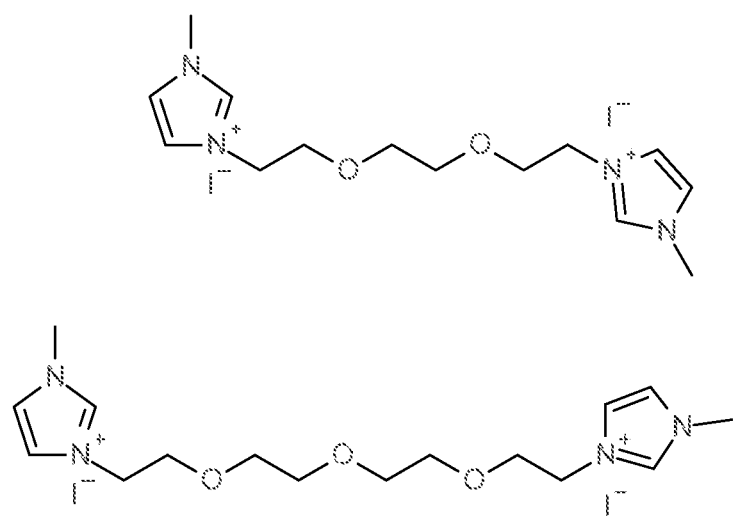
FIG. 1 illustrates ionic liquid electrolytes for DSSC reported by Zafer et al., 2009 [ibid.]
Figure 2:
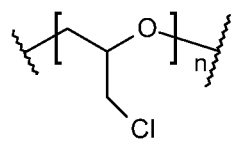
FIG. 2 illustrates a high molecular weight multifunctional halogen derivative of PEG reported by Wang et al., 2006 [ibid.]
Figure 3:
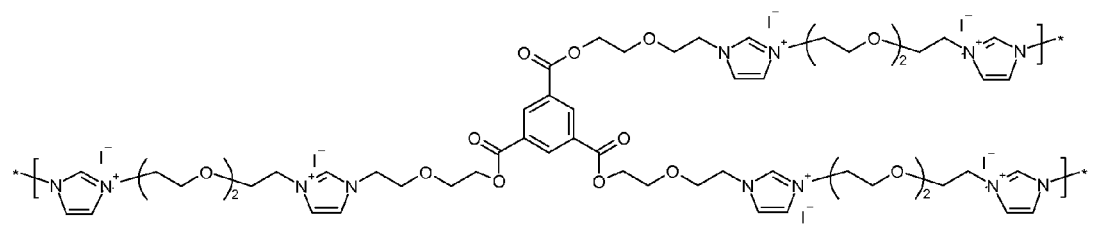
FIG. 3 illustrates chemical structure of polymer electrolyte reported by Shim et al., 2008 [ibid]

The following is a detailed description of producing solid organic electrolytes containing onium cations and iodide anions, which are suitable for use in dye-sensitized solar cells, lithium ion batteries, electrochromic devices, and supercapacitors.

Example 1

Synthesis of PEGylated/fluorinated imidazolium iodide (ZMImI). The three step reaction scheme is illustrated in Scheme 1.

bath was removed and the reaction mixture was allowed to warm to room temperature. After about 24 h, 100 mL of methylene chloride was added to the reaction flask, and the mixture was stirred for 30 min. A clear separation of layers was observed. This mixture was washed (three times) with saturated sodium bicarbonate solution to extract any unreacted tosyl chloride. Pyridine was separated from the product by extraction using 1 M aqueous hydrochloric acid solution (3×). Residual salts from the organic phase were finally removed by washing with distilled water (3×). The organic phase was dried over sodium sulfate overnight, filtered, and concentrated under vacuum at 40° C. A yellow liquid remained in the flask which was dried at 50° C. overnight. The yield of the tosylate (1, cf. Scheme 1) obtained from this reaction was about 78 %, with a purity of 77% (determined by $^1$H NMR). The remainder was unreacted ZOH.

ZOTs $^1$H NMR (400 MHz, CDCl$_3$,δ): 7.8 (d, 2H, ArH), 7.35 (d, 2H, ArH), 4.15 (t, 2H, —CH$_2$OTs), 3.58-3.77 (br s, —OCH$_2$CH$_2$O—), 2.44 (br m, 5H, ArCH$_3$, —CH$_2$CF$_2$—)

Iodination of ZOTs to ZI.

Sodium iodide (180 mmol) was quickly added (without exposing to light) to a stirred solution of 45 mmol of the tosylate (1) in acetone, taken in a round bottom flask. The contents turned deep yellow in color as soon as the sodium iodide was added, and later became lighter in color due to the formation of white precipitate of sodium tosylate. The contents were stirred for 24 h under reflux (using an oil bath at 60° C.). A thick yellow precipitate was formed, with a layer of acetone above it. After 24 h, the reaction was stopped and the acetone was evaporated under vacuum leaving a dry yellow solid in the flask. Methylene chloride (100 mL) and distilled water (80 mL) were added to the contents of the flask, and the

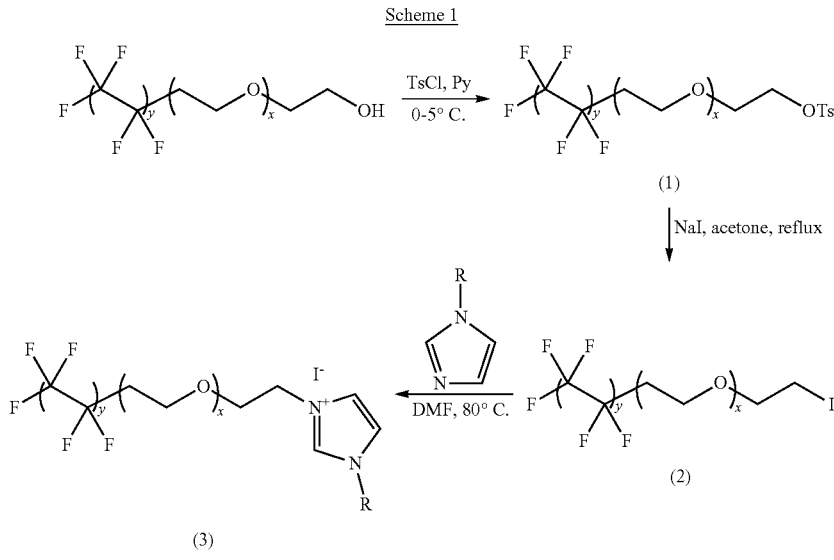

R = hydrocarbyl group (e.g. alkyl, alkenyl, alkynyl, phenyl, benzyl, etc.)

Tosylation of PEGylated/fluorinated Alcohol (Zonyl FSO-100, ZOH).

ZOH (70 mmol) was dissolved in 100 mmol of anhydrous pyridine (Py) in a round bottom flask. The flask was cooled using an ice-water bath, and a solution of 100 mmol of tosyl chloride (TsCl) in 100 mL of methylene chloride was added drop-wise to the flask. A white precipitate was formed immediately after addition of tosyl chloride. After 1 h, the ice-water mixture was stirred for 30 min. The organic and aqueous phases were separated, and the organic phase was washed with 5% aqueous sodium thiosulfate solution (3×) whereupon a clear solution was obtained. The organic phase was washed with saturated sodium bicarbonate solution, and any residual salts in the organic phase were completely removed by washing with distilled water. The organic phase was yellowish in color and was dried over sodium sulfate overnight. The contents were then filtered and methylene chloride was evaporated under vacuum at 40° C. The final product was dried at 50° C. under low vacuum to obtain a viscous yellow liquid. The yield of the PEGylated/fluorinated iodide (2, cf. Scheme 1) was 80%.

$^1$H NMR (400 MHz, CDCl$_3$,δ): 3.56-3.76 (br s, 24H, —OCH$_2$CH$_2$O—), 3.24 (t, 2H, —CH$_2$I), 2.43 (m, 2H, —CH$_2$CF$_2$—).

Quaternization of MIm with ZI.

35 mmol of the ZI was dissolved in 14 mL of N,N-dimethylthrmamide (DMF) taken in a round bottom flask. To this, 75 mmol of 1-methylimidazole was added and the reaction flask was purged with dry nitrogen gas for about 15 min. The contents were stirred under nitrogen over an oil bath heated to 80° C. for two days. The quaternization reaction proceeded with darkening of the yellow color of the reaction mixture. After cooling, the reaction mixture was added drop-wise to cold diethyl ether (~0° C.). The ether was evaporated under vacuum, and the products were dried overnight in a vacuum oven, at 50° C. The yield of zonyl methylimidazolium iodide was about 70%.

$^1$H NMR (400 MHz, CDCl$_3$,δ): 2.36-2.45 (m, 2H, —CH$_2$CF$_2$—), 3.47-3.67 (br s, 26H, —OCH$_2$CH$_2$O—), 3.92 (t, 2H, N$^+$CH$_2$CH$_2$O—), 4.04 (s, 3H, NCH$_3$), 4.59 (t, 2H, N$^+$CH$_2$—), 7.20-7.43 (m, 1H, N$^+$CH), 7.52-7.83 (m, 1H, NCH), 10.02-10.25 (s, 1H, N$^+$CHN)

Example 2

Synthesis of PEGylated Imidazolium Iodides (mPEGn-MImI).

The three-step reaction scheme for the synthesis of the PEGylated imidazolium iodides is illustrated in Scheme 2.

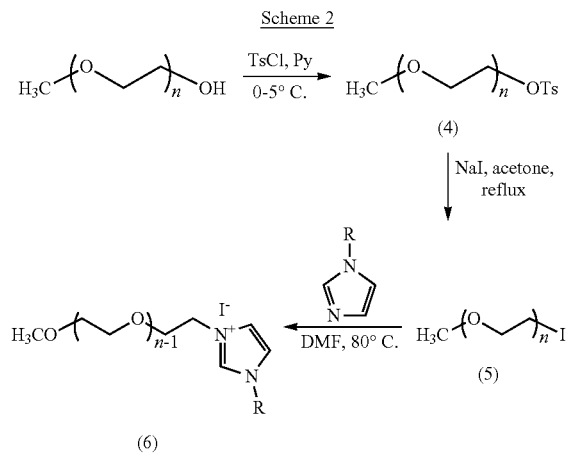

Scheme 2

R = hydrocarbyl group (e.g. alkyl, alkenyl, alkynyl, phenyl, benzyl, etc.)

Taglation of Methoxy Terminated Poly(Ethylene Glycol)s (mPEG7, mPEG12 and mPEG16).

mPEG (30 mmol) was dissolved in 60 mmol of pyridine in a round bottom flask. A solution of 60 mmol of tosyl chloride in 45 mL of methylene chloride was added drop-wise to the flask with cooling (~0° C.). A white precipitate was formed immediately after addition of tosyl chloride. After 1 h, the reaction mixture was warmed to room temperature, and the reaction was allowed to continue further for 24 h at room temperature. 50 mL of methylene chloride were added to the reaction flask and stirred for half-hour. The reaction mixture was extracted with saturated sodium bicarbonate solution, followed by 1 M aqueous hydrochloric acid solution, and finally with distilled water (three times each). The organic phase was dried over sodium sulfate overnight, filtered, and subjected to rotary evaporation at 40° C. under vacuum to evaporate the methylene chloride. A colorless liquid remained in the flask which was dried under vacuum overnight. The yield of mPEG7 tosylate (mPEG7OTs) obtained from this reaction was 84%, with a purity of 93 mol %. The remaining 7 mol % of the product was unreacted mPEG. The yield of mPEG12OTs was 84% with a purity of 89 mol %, and the yield of mPEG16OTs was 75% with a purity of 93 mol %.

$^1$H NMR (400 MHz, CDCl$_3$,δ): 7.8 (d, 2H, ArH), 7.34 (d, 2H, ArH), 4.15 (t, 2H, —CH$_2$OTs), 3.58 (br s, —OCH$_2$CH$_2$O—), 3.37 (s, 3H, —OCH$_3$), 2.44 (s, 3H, ArCH$_3$)

Iodination of Methoxy PEG Tosylate.

Sodium iodide (80 mmol) was quickly added (without exposing to light) to a stirred solution of 20 mmol of the tosylate (4, cf. Scheme 2) in acetone, taken in a round bottom flask. The reaction mixture turned deep yellow in color as soon as the sodium iodide was added and later became lighter in color due to the formation of a white precipitate of sodium tosylate. The contents were stirred for 24 h under reflux. A thick yellow precipitate was formed with a layer of acetone above it. After 24 h, the reaction mixture was concentrated by evaporation of acetone under vacuum, to obtain a yellow solid in the flask. 50 mL of methylene chloride and 40 mL of water were added to this solid and the mixture was stirred for 30 min. The organic and aqueous phases were separated and the organic phase was extracted with 5% sodium thiosulfate solution (three times). The organic phase was washed with saturated sodium bicarbonate solution and distilled water (three times each). The viscous yellow liquid was dried overnight, over sodium sulfate. After filtration, to remove sodium sulfate, methylene chloride was evaporated under vacuum. The final product was further dried in a vacuum oven at 50° C. All the mPEG iodides were yellow in color. The yield of mPEG iodides was about 64%.

$^1$H NMR (400 MHz, CDCl$_3$,δ): 3.56-3.77 (br s, —OCH$_2$CH$_2$O—), 3.37 (s, 3H, —OCH$_3$), 3.24 (t, 2H, —CH$_2$I)

Quaternization of Methyl/Butyl Imidazolium Using Methoxy PEG Iodide.

10 mmol of the iodide was dissolved in 4 mL of DMF taken in a round bottom flask. To this, 20 mmol of the methyl/butyl imidazole were added, and the reaction flask was purged with dry nitrogen gas for about 15 min. The contents were stirred under nitrogen over an oil bath heated to 80° C. for two days. The quaternization reaction proceeded with darkening of color of the reaction mixture. The reaction was turned off and the contents were precipitated in cold (~0° C.) diethyl ether. The ether was evaporated under vacuum and the products were dried overnight under vacuum. The yield of mPEG-MImI was about 66%.

mPEGMImI: $^1$H NMR (400 MHz, CDCl$_3$,δ): 3.38 (s, 3H, —OCH$_3$), 3.54-3.88 (br s, —OCH$_2$CH$_2$—), 3.92 (t, 2H, N$^+$CH$_2$CH$_2$O—), 4.04 (s, 3H, NCH$_3$), 4.59 (t, 2H, N$^+$CH$_2$), 7.44 (s, 1H, N$^+$CH) 7.76 (s, 1H, NCH), 9.80 (s, 1H, N$^{+CHN}$)

Example 3

Synthesis of Alkyl Imidazolium Iodides.

25 mmol of 1-methylimidazole were taken in a round bottom flask and sealed with a rubber septum. To this, 50 mmol of the iodoalkane was added drop-wise over a period of one hour using a syringe. The contents in the reaction flask immediately turned yellow for the reactions with propyl and hexyl iodide and green for the reaction with butyl iodide. The quaternization reaction proceeded with darkening in color of the contents. The reaction flask was deoxygenated with dry nitrogen gas for about 15 min and the reaction was allowed to run under nitrogen at 80° C. for 2 days. Excess alkyl iodide was washed with ethyl acetate to remove any unreacted reactants. The residual solvent was evaporated under vacuum and the product was further dried in a vacuum oven at 50° C. 1-Alkyl-3-methylimidazolium iodides were yellow liquids.

PrMImI: $^1$H NMR (400 MHz, CDCl$_3$, δ): 1.01 (t, 3H, N$^+$(CH$_2$)$_2$CH$_3$), 2.01 (m, 2H, N$^+$CH$_2$CH$_2$—), 4.13 (s, 3H, NCH$_3$), 4.31 (t, 2H, N$^+$CH$_2$—), 7.49 (s, 1H, NCH), 7.55 (s, 1H, N$^+$CH), 10.06 (s, 1H, N$^+$CHN).

BuMImI: $^1$H NMR (400 MHz, CDCl$_3$, δ): 0.98 (t, 3H, N$^+$(CH$_2$)$_3$CH$_3$), 1.41 (m, 2H, N$^+$(CH$_2$)$_2$CH$_2$—), 1.93 (m, 2H, N$^+$CH$_2$CH$_2$—), 4.13 (s, 3H, NCH$_3$), 4.34 (t, 2H, N$^+$CH$_2$—), 7.41 (s, 1H, NCH), 7.47 (s, 1H, N$^+$CH), 10.13 (s, 1H, N$^+$CHN).

HexMImI: $^1$H NMR (400 MHz, CDCl$_3$, δ): 0.88 (t, 3H, N$^+$(CH$_2$)$_5$CH$_3$), 1.33 (m, 6H, N$^+$CH$_2$CH$_2$(CH$_2$)$_3$—), 1.93 (m, 2H, N$^+$CH$_2$CH$_2$—), 4.13 (s, 3H, NCH$_3$), 4.32 (t, 2H, N$^+$CH$_2$—), 7.41 (s, 1H, NCH), 7.47 (s, 1H, N$^+$CH), 10.13 (s, 1H, N$^+$CHN).

Synthesis of 1-ethyl-3-methylimidazolium Iodide.

200 mmol of 1-methylimidazole was taken in a round bottom flask and sealed with a rubber septum. To this, 100 mmol of iodoethane were added drop-wise over a period of one hour using a syringe. The contents in the flask began to bubble rapidly and turned light yellowish in color. The reaction flask was deoxygenated with dry nitrogen gas for about 15 min. The reaction was carried out at 80° C. for 2 days, under an inert nitrogen atmosphere. The contents were then precipitated drop-wise in cold diethyl ether and a white powder settled down. The ether phase was decanted and the contents were dissolved in chloroform, reprecipitated in ether several times, filtered, and dried in a vacuum oven at 50° C. The final product was a light yellowish powder.

$^1$H NMR (400 MHz, CDCl$_3$,δ):1.63 (t, 3H, N$^+$CH$_2$CH$_3$), 4.12 (s, 3H, NCH$_3$), 4.42 (q, 2H, N$^+$CH$_2$—), 7.50(s, 1H, NCH), 7.48(s, 1H, N$^+$CH), 10.07 (s, 1H, N$^+$CHN)

Example 4

Thermogravimetric Analysis of ZMImI and EtMImI.

Figure 4:
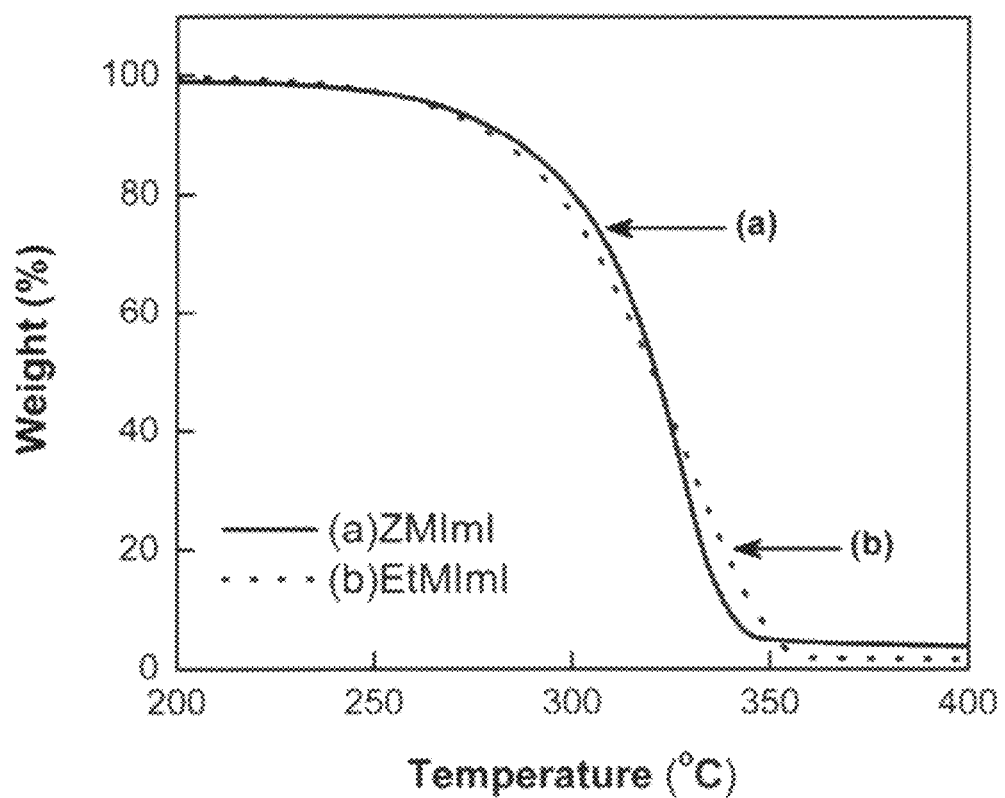
FIG. 4 illustrates the thermogravimetric data for ZMImI and EtMImI.

Thermal stability and degradation of the electrolytes were studied using Perkin Elmer Pyris 1 thermogravimetric analyzer. About 30 mg of sample was heated in a platinum pan, under nitrogen atmosphere, over a temperature range of 40-600° C., at a heating rate of 15° C./min. The percent mass of ZMImI and EtMImI remaining in the pan, at different temperatures, are shown in FIG. 4. Both the salts were stable until about 250° C.

FIG. 4 illustrates the thermogravimetric data for ZMImI and EtMImI.

Example 5

Thermogravimetric Analysis of mPEGnMImI and RnMImI.

Figure 5:
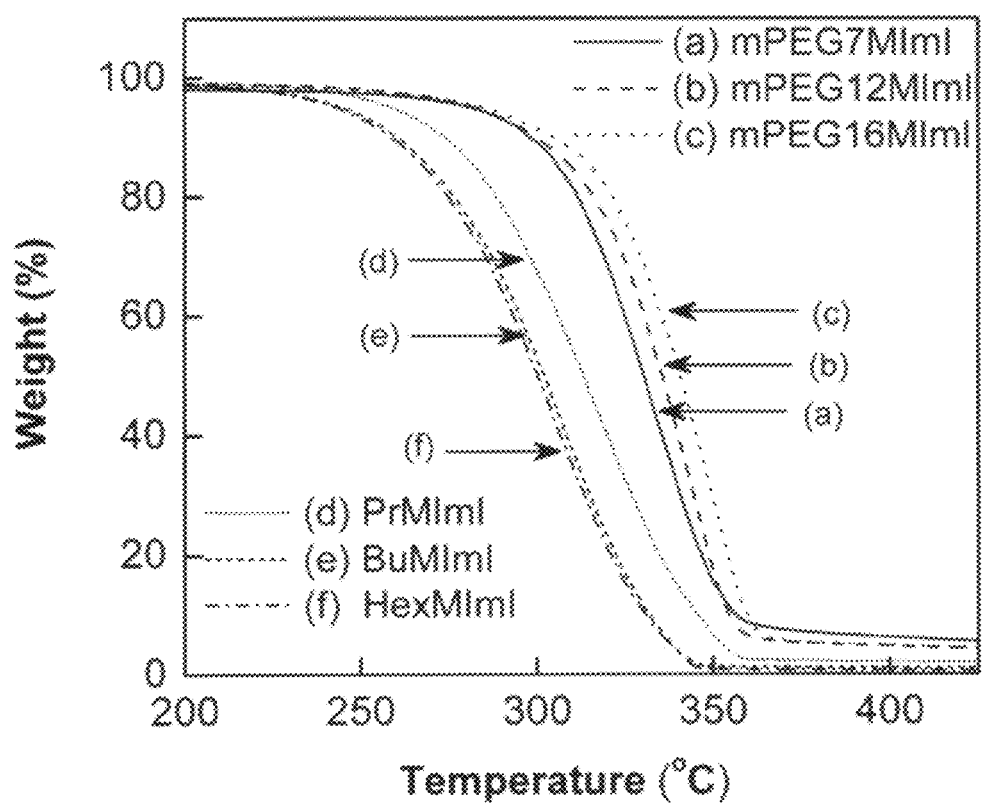
FIG. 5 illustrates thermogravimetry data for 1-methylimidazolium iodides with mPEG and n-alkyl side chains.

The decrease in mass of the PEGylated imidazolium iodides, because of heating in nitrogen atmosphere, is shown in FIG. 5, in comparison with the alkyl imidazolium iodides. All the organic salts were thermally stable up to at least 250° C. The alkyl imidazolium iodides started decomposing at about 250° C. Thermal stability increased with a decrease in the length of the alkyl side chain. The PEGylated imidazolium iodides were found to be more stable than the alkyl imidazolium iodides, with decomposition temperatures greater than 300° C.

FIG. 5 illustrates thermogravimetry data for 1-methylimidazolium iodides with mPEG and n-alkyl side chains.

Example 6

Thermal Transitions of EtMImI and ZMImI.

The thermal transitions were studied using a TA Instruments DSC Q100. Before the DSC experiment, the pure electrolytes and the blends were dried for 24 h under vacuum at 40° C. EtMImI (10.4 mg) and a blend of EtMImI and ZMImI in 1:3 mole ratio (27.6 mg) were weighed in aluminum pans and sealed with lids that contained pin holes. Temperature scans were performed in the range of −80 to 120° C. using a cooling rate of 20° C./min and heating rate of 2° C./min.

Figure 6:
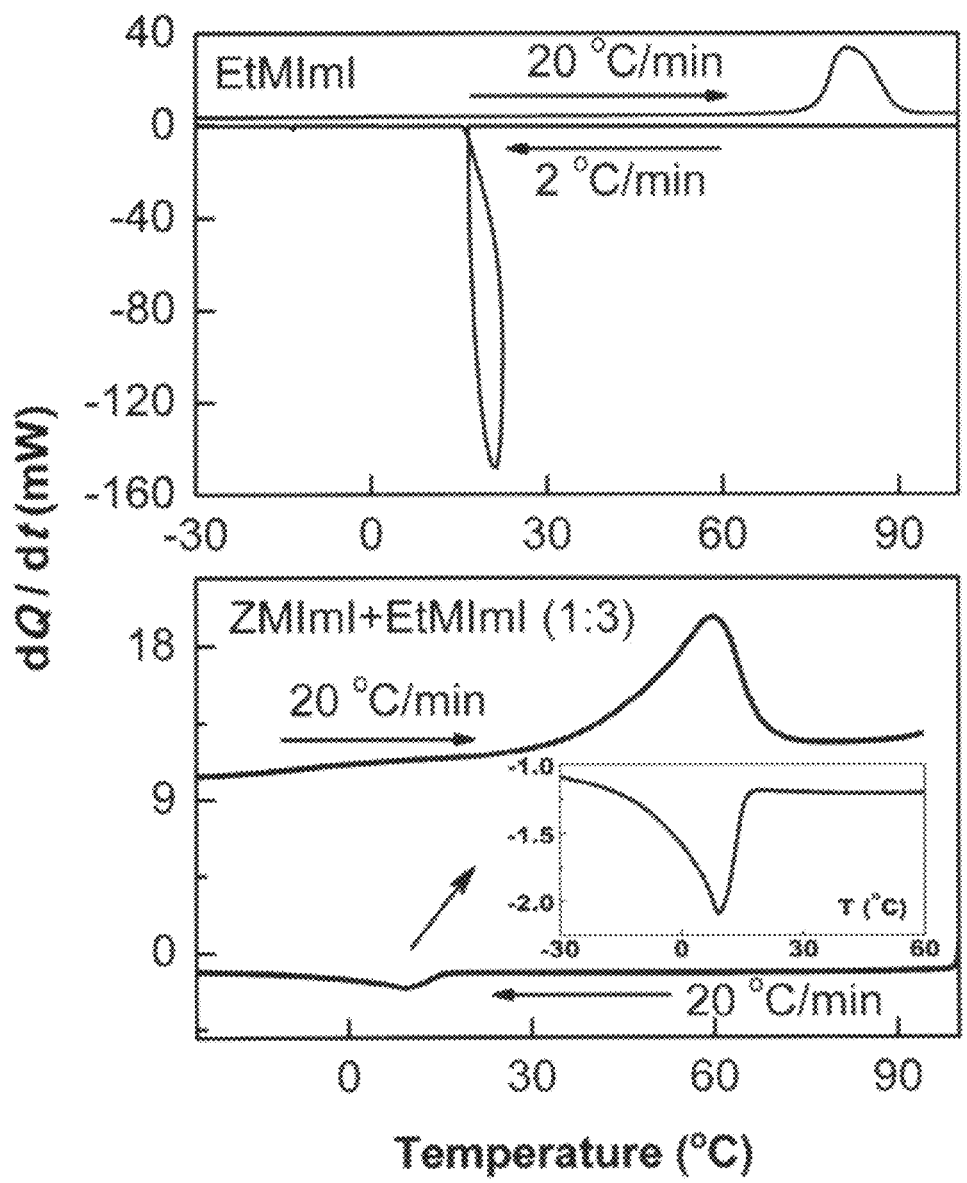
FIG. 6 illustrates DSC thermograms showing the melting and freezing peaks of pure EtMImI (top) and 1:3 (mole ratio) blend of ZMImI and EtMImI (bottom) using a heating rate of 20° C./min and cooling rate of 2° C./min.

Pure ZMImI, and the 1:1 and 3:1 (mole ratio) blends of ZMImI and EtMImI did not show any peaks in the range −80 to 120° C. Peaks were only observed in pure EtMImI and the 1:3 blend of ZMImI and EtMImI. Both the samples showed widely separated crystallization and melting peaks indicating the stable existence of the crystallized state. The thermal transitions of EtMImI are illustrated in FIG. 6. EtMImI showed a broad endothermic melting peak at 81.5° C. with an enthalpy of melting of about 80.4 J/g and a sharp exothermic crystallization transition at about 21.3° C. The thermal transitions of the EtMImI/ZMImI blend are shown in (bottom) of the FIG. 6. The blend showed a broad endothermic melting peak at 59.8° C. with an enthalpy of melting of about 12.96 J/g and a less prominent crystallization peak (magnified in the inset) at 9.2° C., with an enthalpy of freezing of about 12.42 J/g.

FIG. 6 illustrates DSC thermograms showing the melting and freezing peaks of pure EtMImI (top) and 1:3 (mole ratio) blend of ZMImI and EtMImI (bottom) using a heating rate of 20° C./min and cooling rate of 2° C./min.

Example 7

Thermal Transitions of PEGylated Imidazolium Iodides.

The thermal transitions were studied using a TA Instruments DSC Q100. Before the DSC experiment, the pure electrolytes and the blends were dried in vacua for 24 h at 50° C. 15 mg of mPEG7MImI, 12 mg of mPEGI2MImI and 11 mg of mPEG16MImI were weighed separately in aluminum pans and sealed with lids containing pin holes. Temperature scans were performed in the range of −80 to 120° C. using a cooling rate of 20° C./min and heating rate of 2° C./min.

Figure 7:
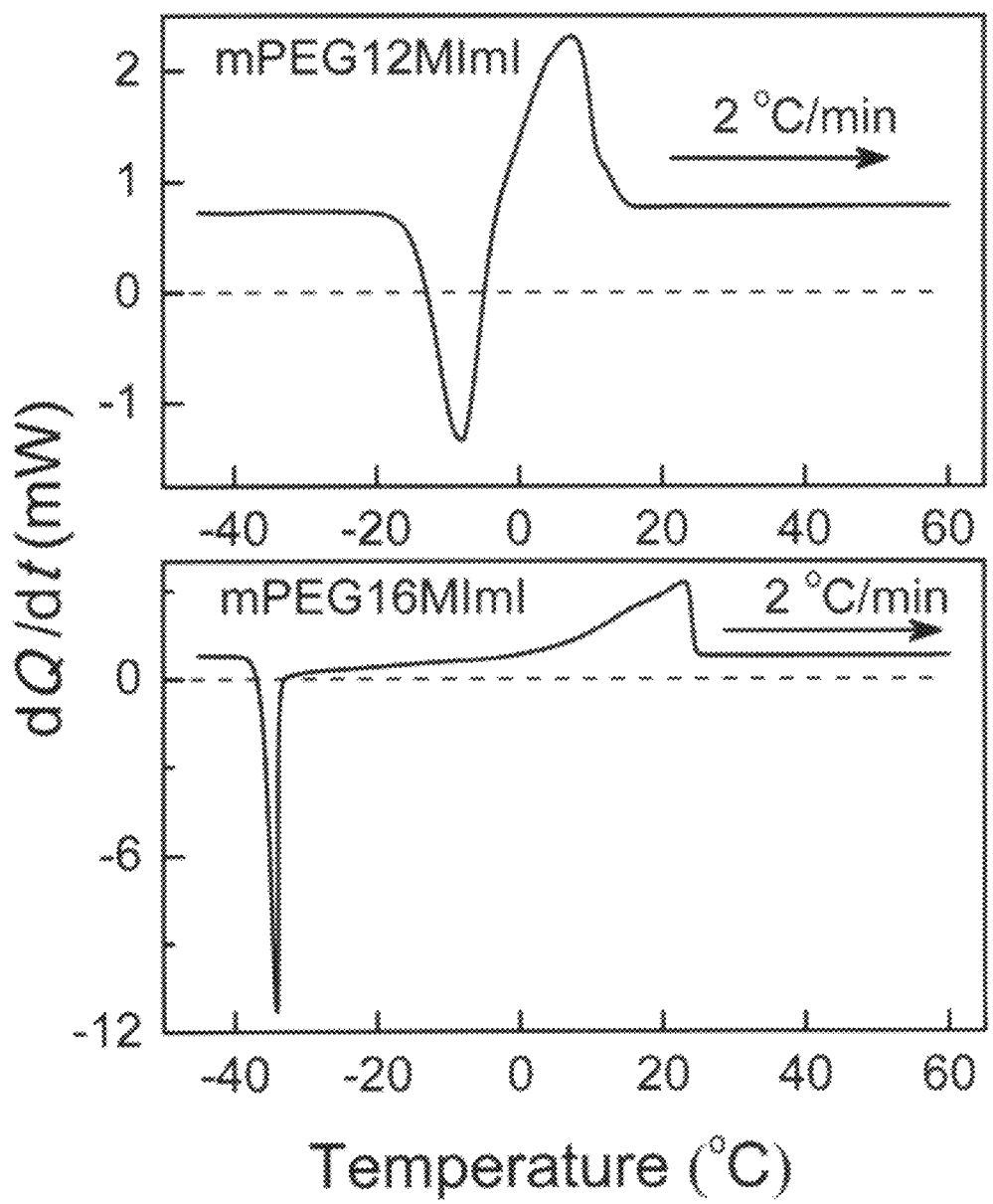
FIG. 7 illustrates DSC thermograms of mPEG12MImI (top) and mPEG16MImI (bottom) showing the melting and cold crystallization peaks for a heating rate of 2° C./min and a cooling rate of 20° C./min.

FIG. 7 illustrates DSC thermograms of mPEG12MImI (top) and mPEG16MImI (bottom) showing the melting and cold crystallization peaks for a heating rate of 2° C./min and a cooling rate of 20° C./min.

mPEG7MImI did not show any transitions in the scanned temperature range of −80 to 80° C. With mPEG12MImI, a cold crystallization peak was observed at −8.1° C. with an onset temperature of −14.2° C., and a melting temperature was observed at about −7.3° C. with an onset temperature close to 2° C. (cf. FIG. 7). The enthalpies of melting and crystallization were both equal to about 36 J/g. In the case of mPEG16MImI, a cold crystallization peak was observed at −34° C. (onset at −36° C.) and the melting temperature is about 23.1° C. (onset at about 7° C.) for a heating rate of 2° C./min, with enthalpy of heating and crystallization both equal to about 76 J/g.

Example 8

Viscosity Measurements of ZMImI and EtMImI.

Viscosities were measured using Brookfield LVDV-II+Pro model cone and plate viscometer with a CP 52 cone spindle that has an operation range of about 5 to 92000 cP. Temperatures greater than 85° C. imparted some fluidity to ZMImI, allowing viscosity measurements using this instrument. The viscosity of EtMImI could be measured at a temperature of 45° C., or higher. ZMImI exhibited a non-Newtonian viscosity, such that the viscosity decreased with increasing shear rate (cf. FIG. 8, top). The paste-like consistency makes ZMImI suitable for coating on substrates in roll-to-roll processing. EtMImI, on the other hand, was found to be Newtonian at temperatures higher than 45° C. The viscosity increased significantly below 45° C. and was beyond the measurement range of the viscometer. Fluidity of EtMImI decreases significantly as the temperature approaches its freezing point of about 21.3° C.

Figure 8:
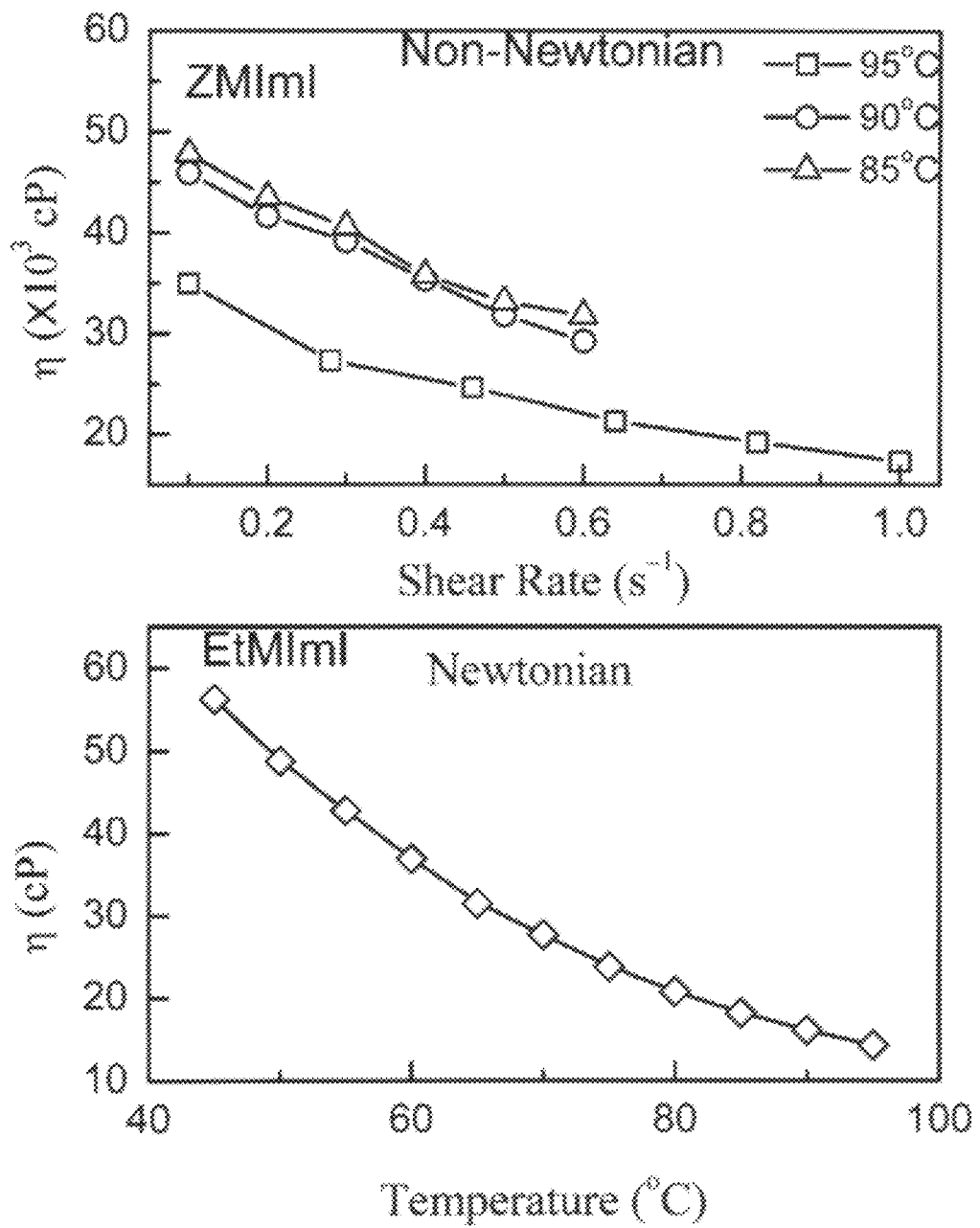
FIG. 8 illustrates temperature dependence of the shear thinning (non-Newtonian) viscosity of ZMImI (top) and shear independent viscosity of EtMImI (bottom). In both panels, the solid lines connect the data points to guide the trend.

FIG. 8 illustrates temperature dependence of the shear thinning (non-Newtonian) viscosity of ZMImI (top) and shear independent viscosity of EtMImI (bottom). In both panels, the solid lines connect the data points to guide the trend.

Example 9

Viscosity Measurements of PEGylated Imidazolium Iodides and Alkyl Imidazolium Iodides.

The viscosities of the PEGylated and alkylated imidazolium iodides were determined in the temperature range of 20-95° C. using Brookfield LVDV-II+Pro model cone and plate viscometer with a CP 52 cone spindle that has an operation range of about 5 to 92000 cP. The viscometer was sealed with a Teflon tape to prevent the sample from absorbing ambient moisture during viscosity measurements.

Figure 9:
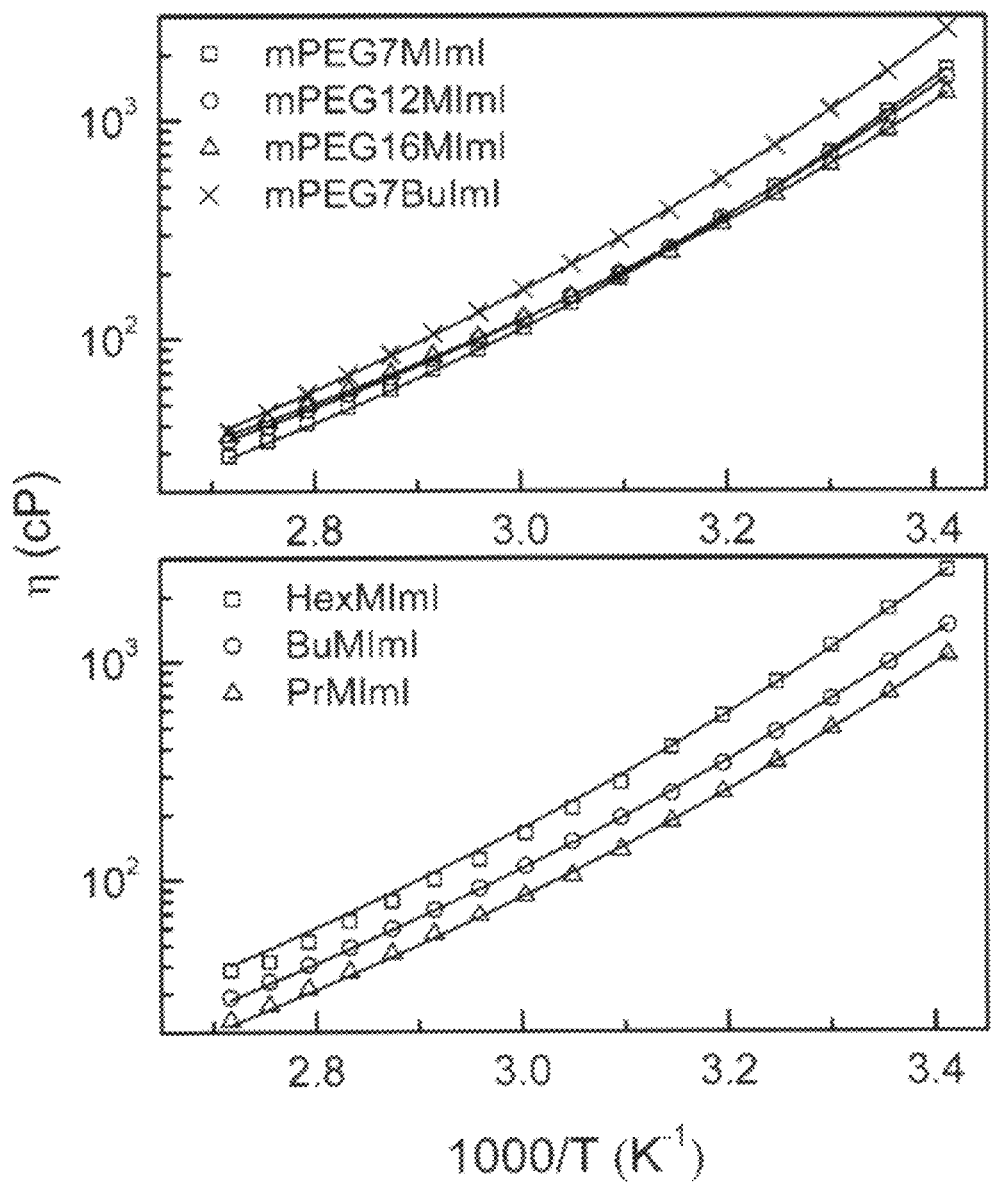
FIG. 9 illustrates temperature dependence of viscosity η, of the PEGylated imidazolium iodides (top) and alkyl imidazolium iodides (bottom)

FIG. 9 illustrates temperature dependence of viscosity, η, of the PEGylated imidazolium iodides (top) and alkyl imidazolium iodides (bottom). Different symbols in the plots correspond to experimental data recorded for the different electrolytes, and the solid lines are the best-fit curves based on the Vogel-Fulcher-Tammann equation. In each panel, the inset shows the details of the viscosity at high temperatures.

All the imidazolium iodides with mPEG and alkyl side chains were Newtonian liquids over the temperature range studied (20-95° C.). Their viscosities were independent of shear rate. The viscosity decreased with increase in temperature. The viscosity of the alkylimidazolium iodides increased with an increase in the alkyl chain length. The PEGylated imidazolium iodides also showed an increase in viscosity with an increase in length of side chain, over the temperature range of 60-95° C. But at lower temperatures, closer to the crystallization temperature of mPEG12MImI (−8° C.), the viscosity of mPEG12MImI was higher than that of mPEG16MImI (which crystallizes at −34° C.). The viscosity of mPEG7MImI was found to be very close to that of BuMImI at higher temperatures (60-95° C.) and the viscosity of mPEG7BuImI was very close to that of HexMImI. The viscosity data could be fitted very well to the Vogel-Fulcher-Tammann equation, $$\eta = \eta_0 \exp\left(-\frac{B}{T-T_0}\right),$$

where η is the measured viscosity. T is the measured temperature and $\eta_0$, B, $T_0$ are the VFT fitting parameters (summarized in Table 1). The $T_0$ values can be grouped based on the nature of the side chain. The PEGylated imidazolium iodides were found to have $T_0$ values close to 190 K, while the alkylimidazolium iodides showed $T_0$ values near about 170 K. The mPEG7BuImI liquid had a $T_0$ value in between these two values.

TABLE 1

Parameters of the VFT equation for temperature dependence of viscosity

| Electrolyte | $\eta_0$ (cP) | B (K) | $T_0$ (K) |
|---|---|---|---|
| mPEG7MImI | 0.12 | 961.4 | −192.7 |
| mPEG12MImI | 0.23 | 865.7 | −194.9 |
| mPEG16MImI | 0.23 | 916.5 | −187.3 |
| mPEG7BuImI | 0.07 | 1195.8 | −179.7 |
| HexMImI | 0.05 | 1329.8 | −171.6 |
| BuMImI | 0.03 | 1382.7 | −164.3 |
| PrMImI | 0.04 | 1242.6 | −171.5 |

Example 10

Ionic Conductivity Measurements of ZMImI and EtMImI.

The ionic conductivity of the electrolytes was determined using standard electrochemical impedance spectroscopy (EIS) method. A home-built cell, consisting of two stainless steel electrodes with a Teflon spacer, was sealed with a Teflon tape and was thermally controlled by TESTEQUITY 105A temperature chamber. The EIS measurements were performed using Solartron 1287A potentiostat/galvanostat, coupled with a model 1252A frequency response analyzer. The AC perturbation was 15 mV and the frequency range was 30-0.3 kHz. The complex impedance data were fitted to an electrode equivalent circuit (EEC) using ZSimpWin™ and validated through Kramers-Kronig relation. The cell constant, determined from standard KCl solution was found to be 0.22 cm$^{-1}$. The resistivity, ρ, and hence the conductivity, κ(=1/ρ) was determined using $$R = \rho \frac{L}{A},$$

where R is the resistance of the electrolyte, L is the length of the path between the electrodes, and A is the surface area of the electrodes. All the aforementioned measurements were duplicated and the results were found to be repeatable.

Figure 10:
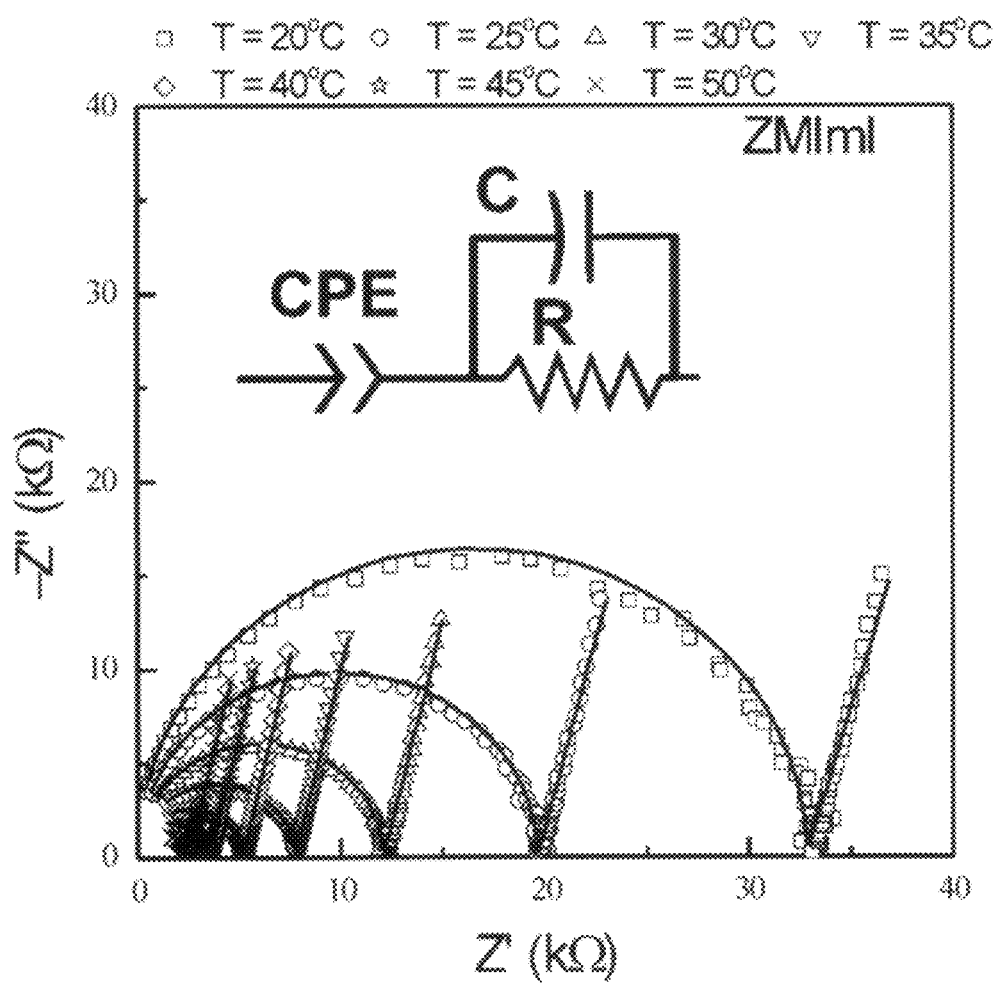
FIG. 10 illustrates the typical electrochemical impedance spectra of ZMImI as a function of temperature.

FIG. 10 illustrates the typical electrochemical impedance spectra of ZMImI as a function of temperature. The data were fitted through the electrical equivalent circuit (EEC) shown in inset of FIG. 10, and the high frequency response was attributed to the bulk resistance.

FIG. 10 illustrates complex impedance plot for the ZMImI as a typical electrolyte for all the electrolytes studied in this disclosure. The symbols represent the experimental data at different temperatures and the lines represent the nonlinear least-squares fits, based on the equivalent circuit shown in inset. $R_S$ is bulk electrolyte resistance.

Figure 11:
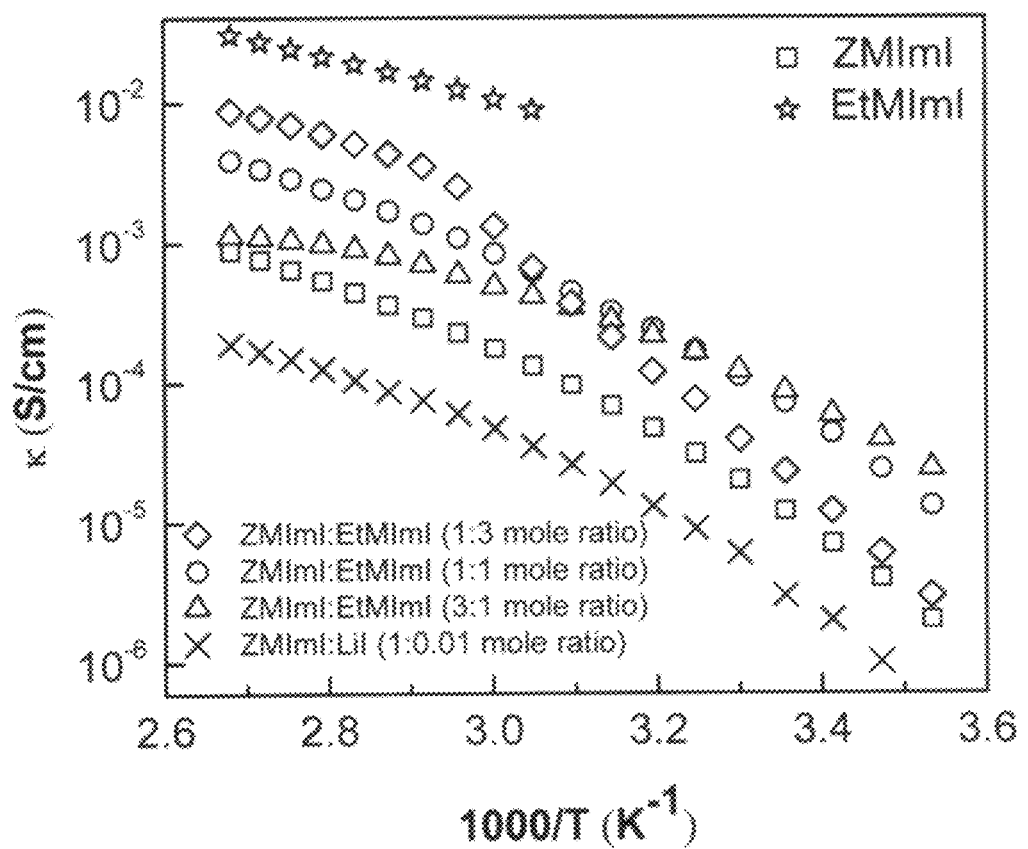
FIG. 11 illustrates temperature dependence of conductivity, κ, of the pure organic electrolytes and the blends

The variation in ionic conductivity with temperature for ZMImI, EtMImI and their blends are shown in FIG. 11. The ionic conductivity was determined from high frequency response from the EIS, which is attributed to the bulk resistance. The ionic conductivity increased with an increase in temperature for the pure solid electrolytes and the blends. Above 50° C. EtMImI showed the highest conductivity of all the electrolytes studied in the present work. The conductivity of pure EtMImI is more than one order of magnitude higher than ZMImI. However, being a powder at room temperature, EtMImI showed poor film forming properties. Therefore, EtMImI was blended with ZMImI. The three blends of ZMImI and EtMImI had ionic conductivity values in between those of the pure electrolytes. The blend with a higher ZMImI:EtMImI mole ratio showed higher room temperature ionic conductivity that was an order of magnitude higher than pure ZMImI. At temperatures higher than 50° C., however, the blend with a higher content of EtMImI had a higher ionic conductivity.

FIG. 11 illustrates temperature dependence of conductivity, κ, of the pure organic electrolytes and the blends. The different symbols correspond to experimental data recorded for different electrolytes indicated in the plots.

Example 11

Ionic Conductivity Measurements of mPEGMImI and AlkylMImI.

Figure 12:
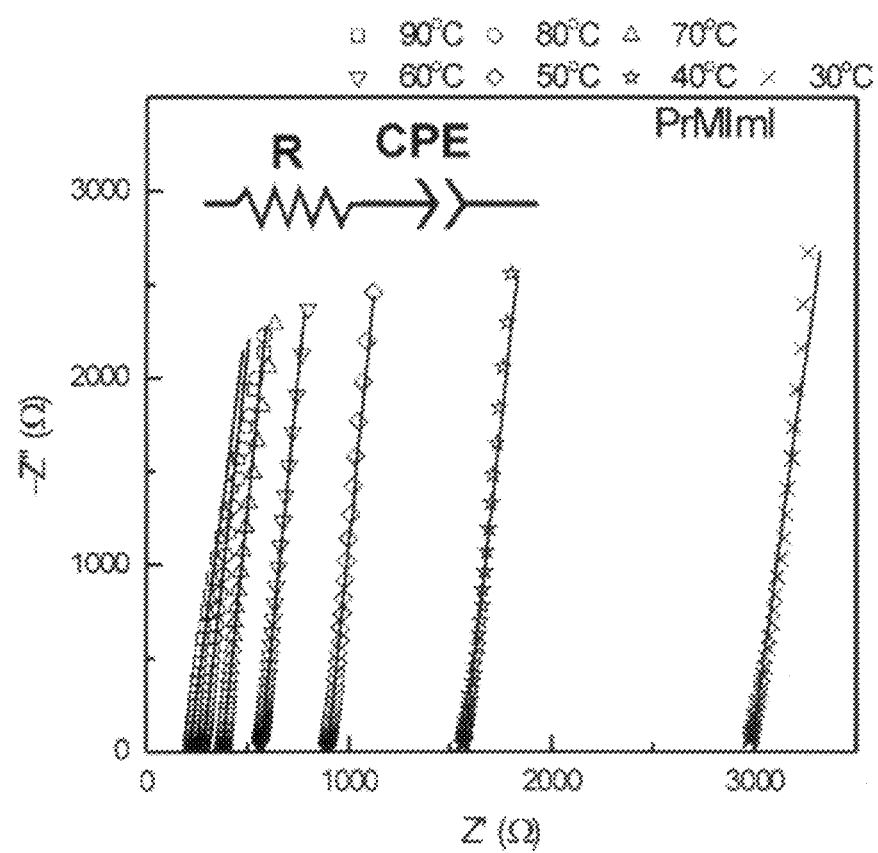
FIG. 12 illustrates complex impedance plot for the PrMImI, as a representative organic salt.

FIG. 12 shows the typical electrochemical impedance spectra of PrMImI as a function of temperature. The data were fitted through the EEC shown in inset of FIG. 12, wherein the high frequency response was attributed to the bulk resistance.

FIG. 12 illustrates complex impedance plot for the PrMImI. The symbols represent the experimental data at different temperatures and the lines represent the non-linear least square fits for the equivalent circuit shown in the inset. $R_s$ is bulk electrolyte resistance and Q is the interface element.

Figure 13:
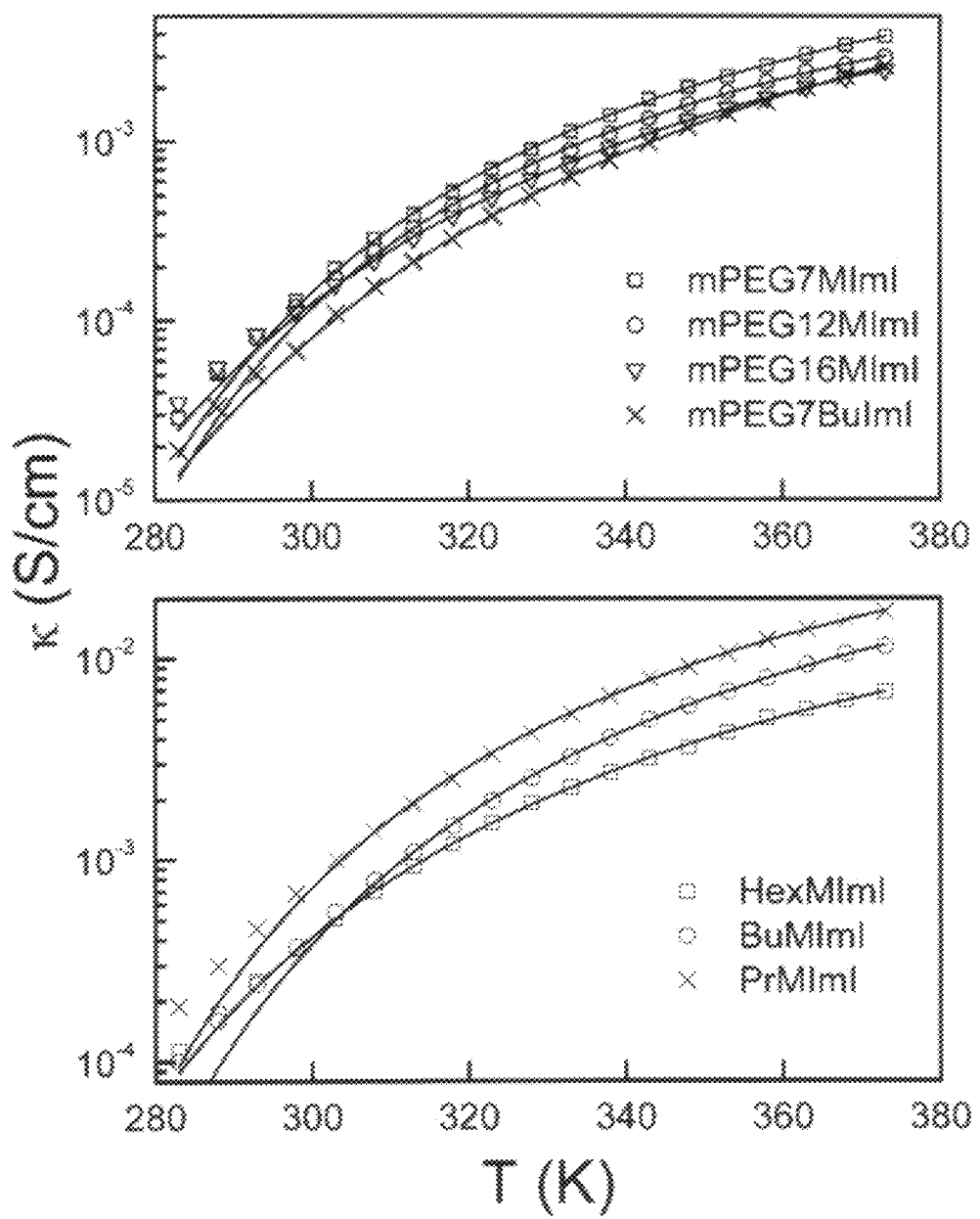
FIG. 13 illustrates the temperature dependence of conductivity, κ, of the PEGylated and alkylated imidazolium iodides.

The temperature dependence of ionic conductivities of the PEGylated imidazolium iodides and the alkylimidazolium iodides is shown in FIG. 13. The ionic conductivity increased with an increase in temperature, due to increase in mobility of the ions, showing a trend opposite to that of viscosity. The conductivity decreased with an increase in the alkyl/PEG side chain length, as expected [Kubo, W.; Kitamura, T.; Hanabusa, K.; Wadaa, Y.; Yanagida, S. Quasi-solid-state dye-sensitized solar cells using room temperature molten salts and a low molecular weight gelator, *Chem Commun.* 2002, 374-375]. This is due to the lower viscosities of the alkyl imidazolium iodides with smaller side chains, which results in greater mobility of iodide ions through the fluid.

FIG. 13 illustrates the temperature dependence of conductivity, κ, of the PEGylated and alkylated imidazolium iodides. The different symbols correspond to experimental data recorded for different liquids indicated in the plots and the solid lines represent the best-fit curves for the VFT equation.

The ionic conductivity data could be fitted very well by the VFT equation, $$\kappa = \kappa_0 \exp\left(-\frac{C}{T - T_1}\right).$$

The best-fit values of the parameters are summarized in Table 2.

TABLE 2

Parameters of the VFT equation for temperature dependence of ionic conductivity

| Electrolyte | $\kappa_0$ (mS/cm) | C (K) | $T_1$ (K) | $\chi^2$ |
|---|---|---|---|---|
| mPEG7MImI | 90.0 | −447.5 | −230.6 | 0.00021 |
| mPEG12MImI | 54.3 | −398.2 | −235.2 | 0.00084 |
| mPEG16MImI | 95.6 | −583.5 | −212.3 | 0.00011 |
| mPEG7BuImI | 261.6 | −775.6 | −204.2 | 0.00011 |
| HexMImI | 166.8 | −498.3 | −216.9 | 0.00367 |
| BuMImI | 296.5 | −459.6 | −230.9 | 0.00723 |
| PrMImI | 349.3 | −425.8 | −231.1 | 0.00884 |

Example 12

To improve the conductivity of organic electrolytes, the addition of inorganic salts, such as those of lithium or potassium, has been studied by many researchers [See, Wang, Y.; Sun, Y.; Song, B.; Xi, J. Ionic liquid electrolytes based on 1-vinyl-3-alkylimidazolium iodides for dye-sensitized solar cells. *Sol. Energy Mater. Sol Cells* 2008, 92, 660-666; Takada, A.; Imaichi, K.; Kagawa, T.; Takahashi, Y. Abnormal viscosity increment observed for an ionic liquid by dissolving lithium chloride, *J. Phys. Chem. B*, 2008, 112, 9660-9662; Kaneko, F.; Masuda., Y.; Nakayama, M.; Wakihara, M. Electrochemical performances of lithium ion battery using alkoxides of group 13 as electrolyte solvent, *Electrochim. Acta.*, 2008, 53, 549-554; Garcia, B.; Lavalle'e, S.; Perron, G.; Michot, C.; Armand, M. Room temperature molten salts as lithium battery electrolyte, *Electrochim. Acta*, 2004, 49, 4583-4588 hereby incorporated herein by reference]. Some researchers reported that although addition of lithium iodide increased the number of charge carriers, it did not increase ionic conductivity, because salt addition led to an increase in viscosity of the electrolyte [See, Kim, S. R.; Parvez, M. K.; In, I.; :Lee, H. Y.; Park, J. M. Novel photo-crosslinkable polymeric electrolyte system based on poly(ethylene glycol) and trimethylpropane triacrylate for dye-sensitized solar cell long-term stability, *Electrochimica Acta*, 2009, 54, 6306-6311 hereby incorporated herein by reference].

Figure 14:
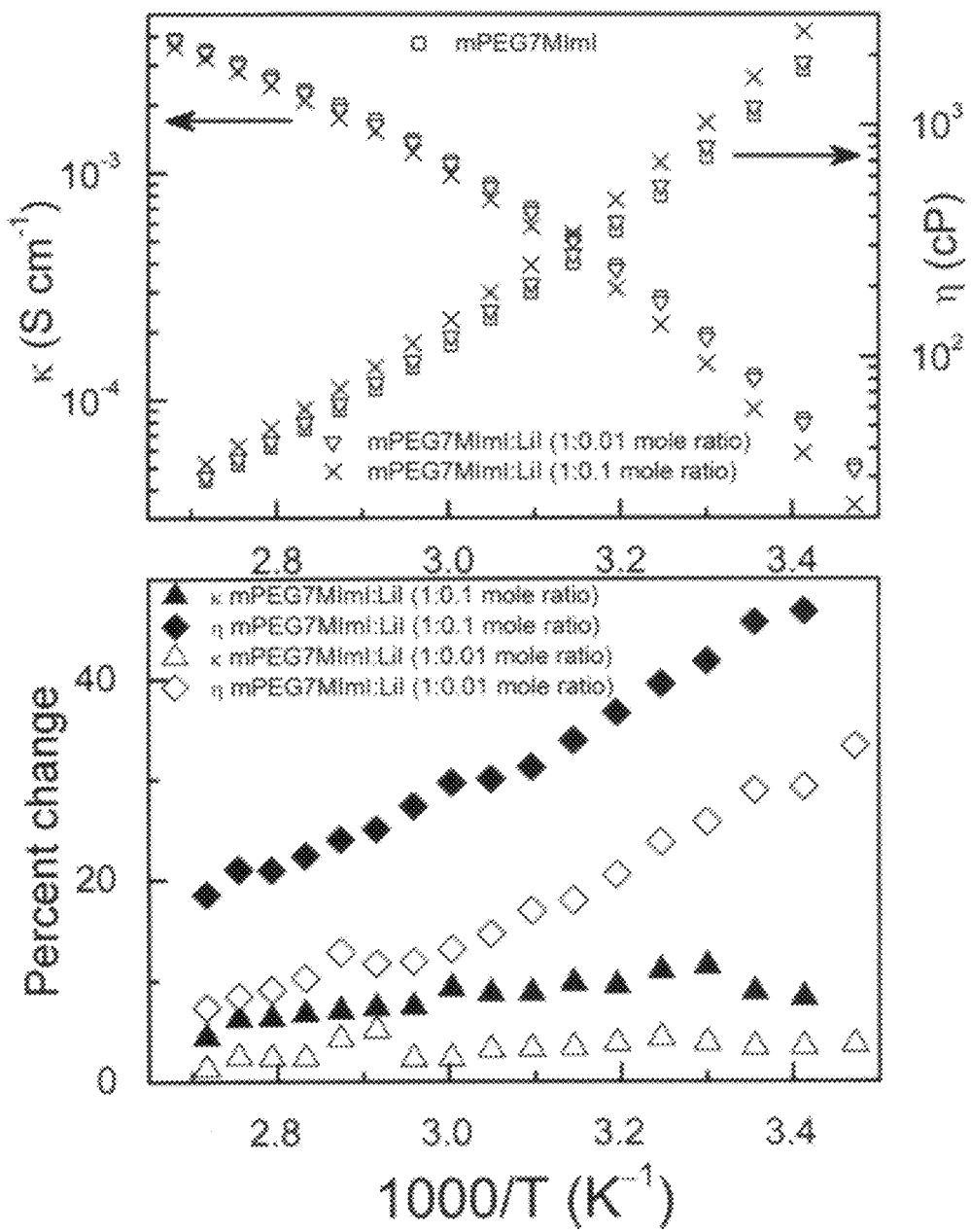
FIG. 14 illustrates comparisons of conductivity, σ, and viscosity, η, of pure mPEG7MImI and its blend with LiI (mPEG7MImI:LiI mole ratios of 1:0.01 and 1:0.1)

The effect of addition of lithium iodide on conductivity and viscosity of mPEG7MImI is illustrated in FIG. 14 (top). The conductivity decreased upon addition of lithium iodide, evidently due to an increase in viscosity. Also, the effect of lithium iodide on viscosity was more than that on conductivity, as shown in FIG. 14 (bottom).

FIG. 14 illustrates comparisons of conductivity, σ, and viscosity, η, of pure mPEG7MImI and its blend with LiI (mPEG7MImI:LiI mole ratios of 1:0.01 and 1:0.1).

A similar decrease in the conductivity of ZMImI, with the addition of LiI, is shown in FIG. 11. However, the blending of EtMImI powder with the PEGylated electrolytes did not affect the viscosity significantly, but resulted in up to an order of magnitude increase in ionic conductivity, as shown in FIGS. 11 and 15.

Figure 15:
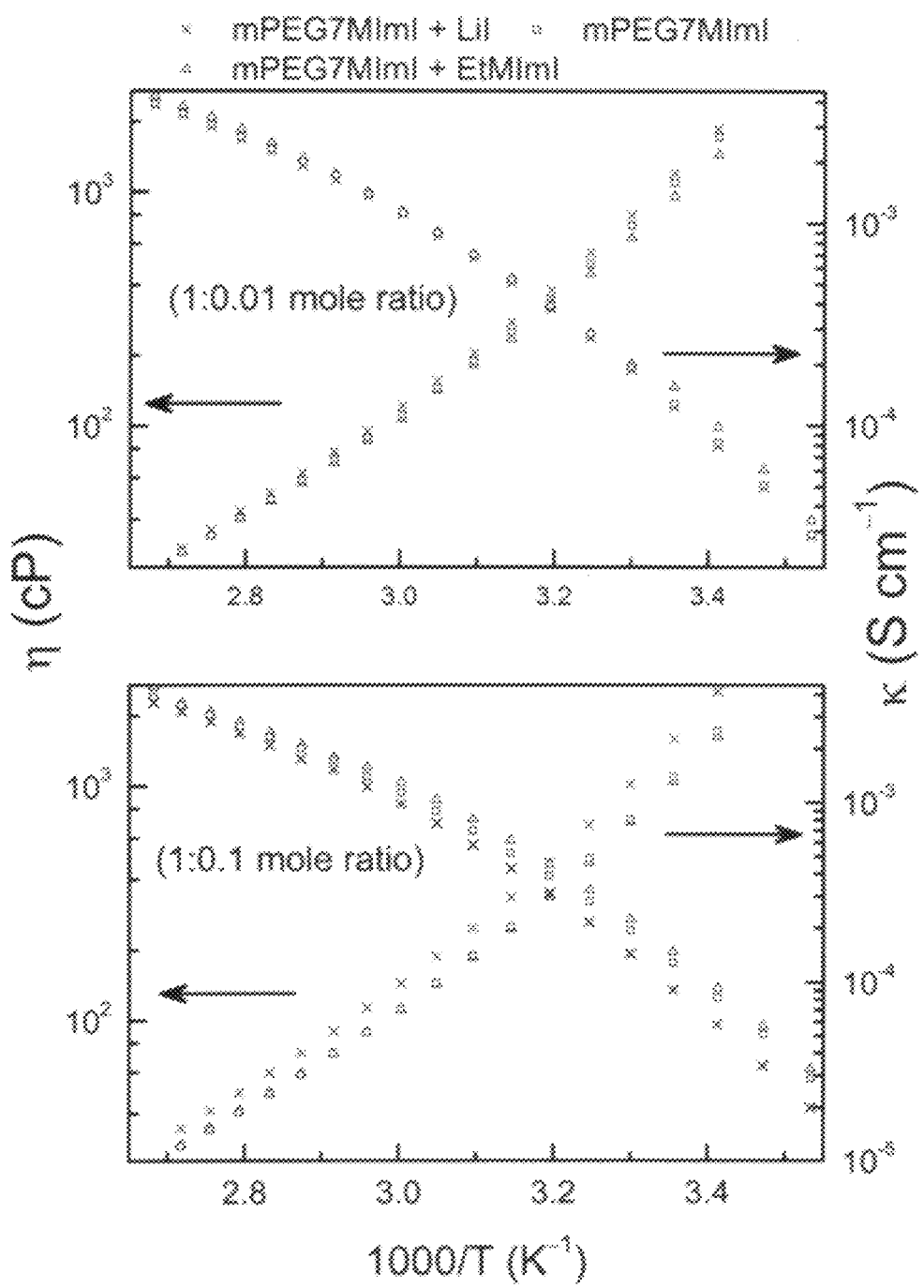
FIG. 15 illustrates the viscosity and the conductivity of mPEG7MImI with EtMImI as a function of temperature.

FIG. 15 illustrates the viscosity and the conductivity of mPEG7MImI with EtMImI as a function of temperature.

Example 13

Figure 16:
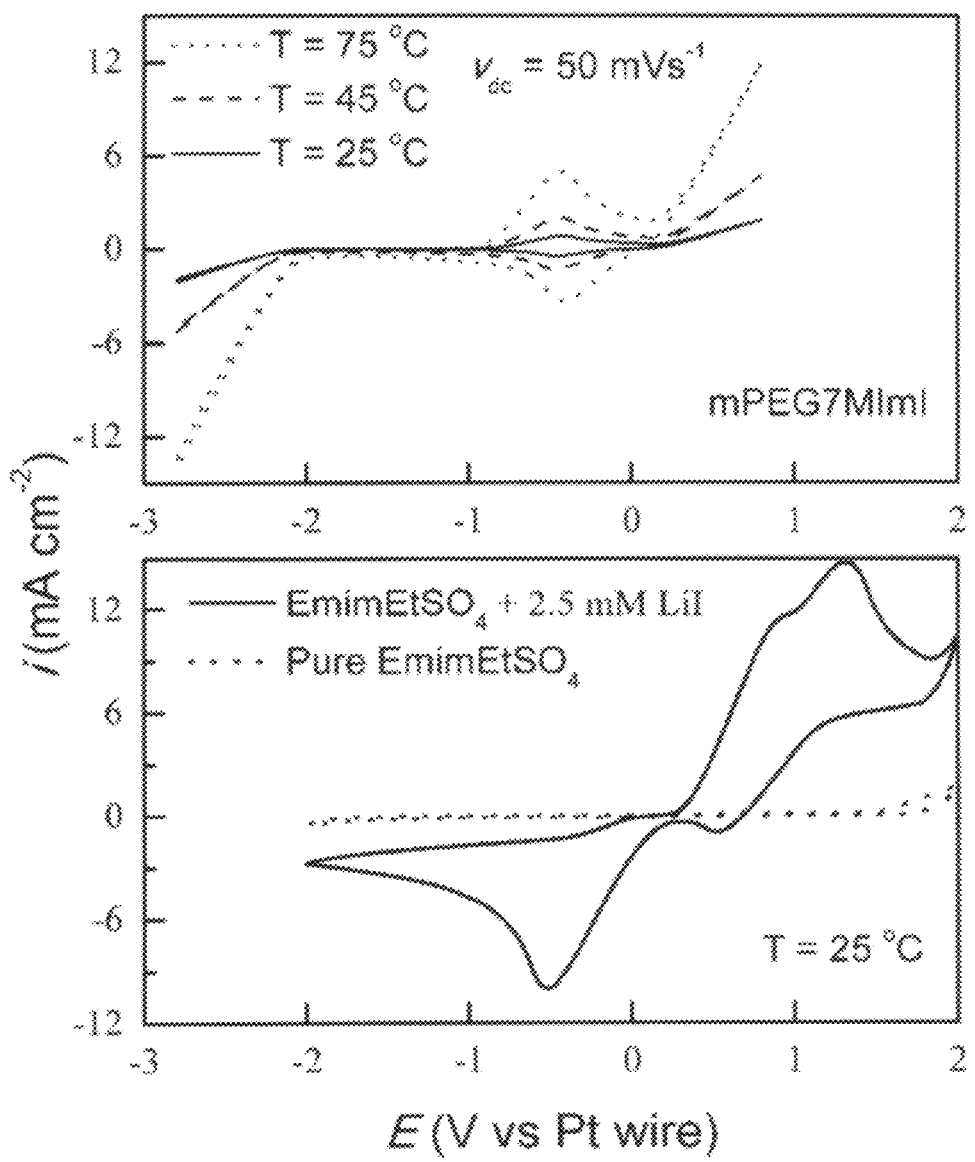
FIG. 16 illustrates cyclic voltammograms for mPEG7MImI at three different temperatures (top); and EmimEtSO$_4$, and EmimEtSO$_4$/LiI blend at room temperature (bottom).

Cyclic voltammetry (CV) was used to determine the electrochemical window of mPEG7MImI. The higher molecular weight PEGylated imidazolium iodides showed rather large resistances at room temperature, which could result in large ohmic drop due to solution resistance during cyclic voltammetry [Bard, A. J.; Faulkner, L. R. introduction and overview of electrode process, *Electrochemical Methods: Fundamentals and Applications*; $2^{nd}$ ed.; Wiley: New York, 2001, p. 25]. Therefore, only mPEG7MImI, the electrolyte with the highest conductivity in the set, was investigated. CV was performed in a three-electrode configuration using a glassy carbon (GC) working electrode, a Pt wire reference electrode and a Pt wire counter electrode. The scan rate was 50 mVs$^{-1}$. The voltammograms obtained at temperatures of 25, 45, and 75° C., are shown in FIG. 16 (top). Compared to the alkylimidazolium salts such as BuMImI and EtMImI, mPEG7MImI showed higher resistance against cathodic reduction, as evident from the more negative range of electrochemical stability. [Hagiwara, R.; Hirashige, T.; Tsuda, T.; Ito, Y. Acidic 1-ethyl-3-methylimidazolium fluoride: A new room temperature ionic liquid. *J. Fluorine Chem.* 1999, 99, 1-3; Lewandowski, A.; Stepniak, I. Relative molar gibbs free energies of cation transfer from a molecular liquid to ionic liquids at 298.15 K. *Phys. Chem. Chem. Phys.* 2003, 5, 4215-4218].

Unlike other imidazolium salts such as EtMImEtSO$_4$ [See, Zheng, J. P; Goonetilleke, P. C.; Pettit, C. M.; Roy, D. Probing the electrochemical double layer of an ionic liquid using voltammetry and impedence spectroscopy: A comparative study of carbon nanotube and glassy carbon electrodes in [EMIm]$^+$[EtSO$_4$], *Talanta* 2010, 81, 1045-1055 hereby incorporated herein by reference], BuMImBF$_4$ [See, Moganty, S. S.; Baltus, R. E.; Roy, D. Electrochemical windows and impedance characteristics of BmimBF$_4$ and BdmimBF$_4$ ionic liquids at the surfaces of Au, Pt, Ta, GC electrodes. *Chem. Phys. Lett.* 2009, 483, 90-94 hereby incorporated herein by reference], the mPEG7MImI at the GC electrode surface was found to be a quasireversible system for both the cation, [mPEG7MIm]$^+$, and the anion, I$^-$.

The electrochemical window (voltage range with small currents) of mPEG7MImI was found to be fairly independent of temperature, as seen in FIG. 16 (top). Apart from the main anodic and cathodic currents appearing outside the electrochemical window, a current feature showing peak-like signature attributes of redox reactions is observed in both the positive and the negative voltage scans. To examine the origin of this current feature, the CV experiments were repeated by adding 2.5 mM LiI (iodide concentration close to that in mPEG7MImI) to EMImEtSO$_4$, and keeping the potential scale the same. The result of this latter experiment is plotted in the lower panel of FIG. 16, where a clear oxidation feature is observed in the positive voltage scan. The dashed line plot in the same panel was recorded with LiI free EMImEtSO$_4$, where no redox features of faradaic reactions were observed. Based on previously published results [See, Hanson, K. J.; Tobias, C. W. Electrochemistry of iodide in propylene carbonate. *J. Electrochem. Soc.* 1987, 134, 2204-2210 hereby incorporated herein by reference], the anodic current features of the solid line plot in the lower panel of FIG. 16 is attributed to the two-step oxidation of iodide to I$_2$: $3I^- \rightarrow I_3^- + 2e^-$, followed by $2I_3^- \rightarrow 3I_2 + 2e^{31}$, with a net reaction of the form, $2I^- \rightarrow I_2 + 2e^-$. The occurrence of this reaction was also detected visually, as the electrolyte turned brown during the positive CV scan around 0.2 V, indicating the generation of I$_2$ at this potential. The features of the two oxidation steps were partially resolved in the LiI containing electrolyte.

The reverse voltage scan in the lower panel of FIG. 16 show the current peaks associated with the reduction of I$_2$ (reverse steps of the aforementioned oxidation reactions). However, due to mass transfer limitation, mostly the interfacial species participated in this reduction process, and some of the dissolved I$_2$ remained un-reduced during the CV scan. This caused the electrolyte to retain its brown color acquired during the positive scan. The reduction peak observed in the lower panel of FIG. 16 falls essentially in the same voltage region where the corresponding cathodic peak is observed in the upper panel of FIG. 16. The I$^-$ oxidation peaks in the two panels are noticeably displaced with respect to each other, because the relative strengths and the surface densities of I$^-$ and the IL anion (EtSO$_4^-$) on GC are likely to be different from the corresponding case for mPEG7MIm. Nevertheless, the overall similarities between the redox current peaks observed in the two panels of FIG. 16 support the inference that these intermediate peaks in mPEG7Mim are due to redox reactions of I$^-$/I$_3^-$/I$_2$.

In summary the disclosure herein describes an electrolyte composition for ion conduction including organic salts that contain onium ions: and a blend of two or more such salts, wherein one or more of the constituents of the blends have an iodide anion. The onium ion is a cation derived from elements of the nitrogen family (Group 15) and oxygen family. The onium ions are selected from the group comprising of imidazolium, triazolium, tetrazolium, ammonium, pyridinium, pyridazinium, pyrrolidinium, pyrrolinium, oxazolidinium, piperazinium, piperidinium, morpholinium, thiazolium, isoquinolinium, guanidinium, phosphonium, and sulfonium. The organic salts are used in dye-sensitized solar cells, electrochromic devices, lithium ion batteries, and supercapacitors.

The electrolyte composition may include a blend of organic salts that have chemical structures depicted in formula I:

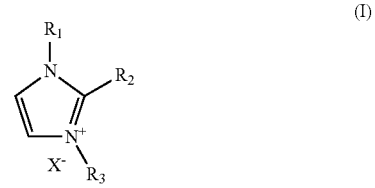

wherein R$_1$, R$_2$, and R$_3$ are independently hydrogen, alkyl, alkenyl, alkynyl, and aryl, provided at least one of R$_1$, R$_2$ and R$_3$ is independently alkyl wherein alkyl is optionally at least partially fluorinated, and X$^-$ is independently iodide, I$^-$, bromide, Br$^-$, chloride, Cl$^-$, perchlorate, ClO$_4^-$, tetrafluoroborate, BF$_4^-$, alkyltrifluoroborate, (perfluoroalkyl)trifluoroborate, dicyanamide, N(CN)$_2^{-1}$, trifluoromethanesulfonate, CF$_3$SO$_3^-$, hexafluorophosphate, PF$_6^-$, bis((trifluoromethyl)sulfonyl)imide, (CF$_3$SO$_2$)$_2$N$^-$, bis((perfluoroethane)sylfonyl)imide, (CF$_3$CF$_2$SO$_2$)$_2$N$^-$, nitro, NO$_2^-$, nitrate, NO$_3^-$, sulfate, SO$_4^-$, or tosylate, wherein in at least one component of the blend, X$^-$ is iodide, I$^-$.

The electrolyte composition disclosed herein may be at least partially fluorinated and includes an alkyl group that has at least one hydrogen atom replaced by a fluorine atom. The partially fluorinated groups further include any carbon chains, or carbon chains that are interrupted by one or more heteroatoms (for example, oxygen), that contain one of more fluorine atoms.

The electrolyte composition includes an organic salt of formula I wherein at least one of R$_1$, R$_2$ and R$_3$ is independently alkyl-terminated oligo(ethylene glycol):

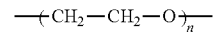

wherein n is about 1 to about 25;

The electrolyte composition further includes an organic salt wherein at least one of R$_1$, R$_2$ and R$_2$ is independently a moiety of formula Z:

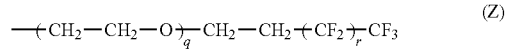

wherein q is independently 1 to about 25; r is independently 0 to about 18;

The electrolyte composition may include an organic salt of formula I wherein at least one of R$_1$, R$_2$ and R$_3$ independently, contains a polymerizable vinyl group, for example, vinyl, acrylate, or methacrylate group.

The electrolyte composition has a viscosity greater than 90,000 cP and an ionic conductivity of at least $1 \times 10^{-4}$ S/cm at 30° C. Additionally the electrolyte composition has a viscosity greater than 39,000 cP (0.1 s$^{-1}$ shear rate) and an ionic conductivity of at least $2.88 \times 10^{-3}$ S/cm at 90° C.

The electrolyte composition may be blended with lithium salts for use as electrolytes in lithium ion batteries and electrochromic windows.

The electrolyte composition does not show mass loss greater than 1.5% when heated up to a temperature of 200° C.

The term "onium ion" refers to a cation derived from elements of the nitrogen family (Group 15) and the oxygen family (Group 16). Some examples of the onium ion are shown in the following Chart 1.

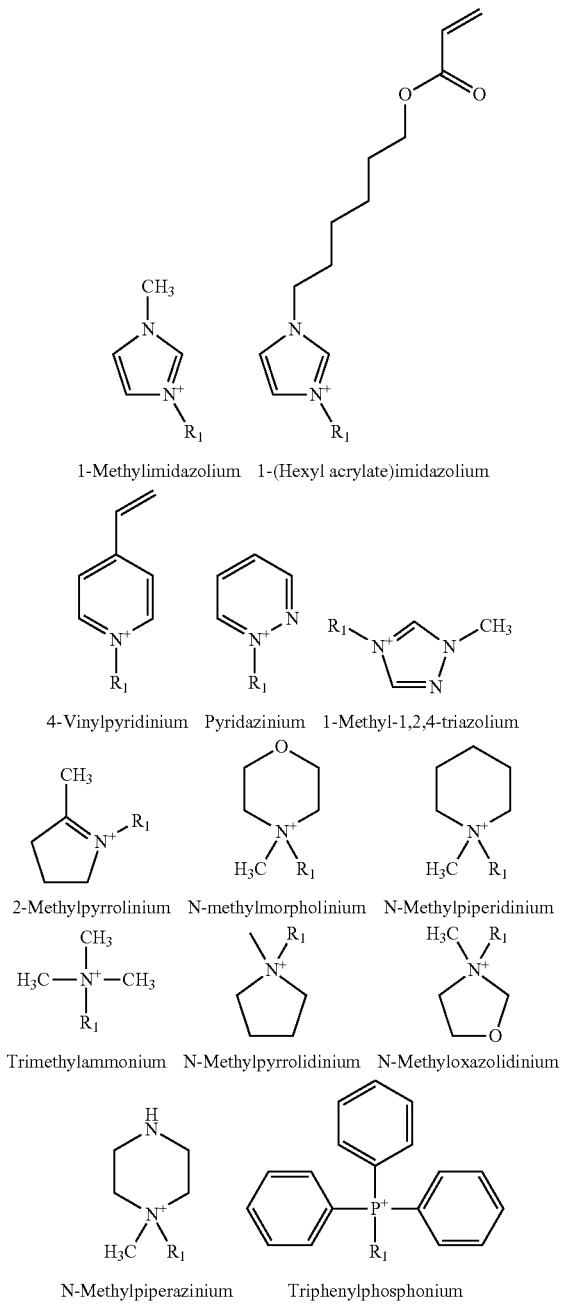

Chart 1

The term "at least partially fluorinated" refers to a group, for example an alkyl group that has at least one hydrogen atom replaced by a fluorine atom. Partially fluorinated groups include any carbon chains, or carbon chains that are interrupted by one or more heteroatoms (for example, oxygen), that contain one of more fluorine atoms.

Materials

The materials used in the experiments described above include the following. Methoxy-terminated polyethylene glycols (mPEG, CAS no. 9004-74-4; FW 350, 550 and 750, Aldrich), p-toluenesulfonyl chloride (CAS no. 98-59-9, FW 190.65, Aldrich. 99%), iodoethane (CAS no.75-03-6, FW 155.97, Aldrich, 99%), iodopropane (CAS no.107-08-4, FW 169.99, Aldrich, 99%), iodobutane (CAS no.542-69-8, FW 184.02, Aldrich, 99%), iodohexane (CAS no. 638-45-9, FW 212.07, Aldrich, 98%), anhydrous sodium iodide (CAS no.7681-82-5, FW 149.89, Aldrich, 99.999%), methylimidazole (CAS no.616-47-7, FW 82.1, Aldrich, 99%), butylimidazole (CAS no.4316-42-1, FW 124.18, Aldrich, 98%) were obtained from sigma Aldrich and used without further purification. Anhydrous pyridine, methylene chloride, acetone, dimethylformamide, sodium bicarbonate, hydrochloric acid, sodium thiosulfate, and anhydrous sodium sulfate were obtained from Fisher. Diethyl ether (99%) was obtained from Alfa Aesar. Unless specified, all chemicals were used as received. The ethoxylated fluoroalkyl surfactant, Zonyl FSO-100 (registered trademark of E. I. du Pont de Nemours & Co., Inc.; CAS no. 65545-80-4), was obtained from Sigma-Aldrich.

All the features disclosed in this specification (including any accompanying claims, abstract, and drawings) may be replaced by alternative features serving the same, equivalent or similar purpose, unless expressly stated otherwise. Thus, unless stated otherwise, each feature disclosed is one example only of generic series of equivalent or similar features.

We claim:

1. An electrolyte composition for ion conduction comprising:
    one or more organic salts that contain onium ions;
    wherein at least one of said salts has at least one iodide anion, and
    wherein an onium ion is a cation derived from elements of the nitrogen family (Group 15) and the oxygen family (Group 16);
    and at least one organic salt contains an onium ion, selected from the group consisting of imidazolium, triazolium, tetrazolium, ammonium, pyridinium, pyridazinium, pyrrolidinium, pyrrolinium, oxazolidinium, piperazinium, piperidinium, morpholinium, thiazolium, isoquinolinium, guanidinium, phosphonium, and sulfonium, contains a group that is at least partially fluorinated;
    wherein "at least partially fluorinated" means that the group has at least one hydrogen atom replaced by a fluorine atom;
    wherein said partially fluorinated group further comprises a carbon chain that is interrupted by one or more heteroatoms of the oxygen family; and
    wherein said partially fluorinated group is a moiety of formula Z:

$$-(CH_2-CH_2-O)_q-CH_2-CH_2-(CF_2)_r-CF_3. \quad (Z)$$

wherein q is independently 1 to about 25; and r is independently 0 to about 18.

2. The electrolyte composition of claim 1 wherein at least one organic salt is of formula I:

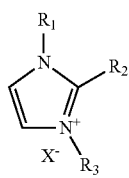 (I)

wherein $R_1$, $R_2$, and $R_3$ are independently hydrogen, alkyl, alkenyl, alkynyl, and aryl; and provided at least one of $R_1$, $R_2$ and $R_3$ is independently alkyl, wherein the alkyl is at least partially fluorinated; and $X^-$ is independently iodide bromide, chloride, perchlorate, tetrafluoroborate, alkyltrifluoroborate, (perfluoroalkyl)trifluoroborate, dicyanamide, trifluoromethanesulfonate, hexafluorophosphate, bis((trifluoromethyl)sulfonyl)imide, bis((perfluoroethane)sulfonyl)imide, nitrite, nitrate, sulfate, or tosylate.

3. The electrolyte composition of claim 2, wherein at least one of the $R_1$, $R_2$, and $R_3$ groups of the said organic salt of formula I, independently contain polymerizable vinyl, acrylate, or methacrylate groups.

4. The electrolyte composition of claim 1 wherein said composition has viscosity greater than 90,000 cP and an ionic conductivity of at least $1 \times 10^{-4}$ S/cm at 30° C.

5. The electrolyte composition of claim 1 wherein said composition does not show mass loss greater than 1.5% when heated up to a temperature of 200° C.

6. The electrolyte composition of claim 1 wherein said electrolyte is used in dye-sensitized solar cells, electrochromic devices, lithium ion batteries, and supercapacitors.

7. The electrolyte composition of claim 1, further comprising lithium salts.

* * * * *